United States Patent
Borthakur et al.

(10) Patent No.: US 8,697,473 B2
(45) Date of Patent: Apr. 15, 2014

(54) METHODS FOR FORMING BACKSIDE ILLUMINATED IMAGE SENSORS WITH FRONT SIDE METAL REDISTRIBUTION LAYERS

(75) Inventors: Swarnal Borthakur, Boise, ID (US); Kevin W. Hutto, Kuna, ID (US); Andrew Perkins, Boise, ID (US); Marc Sulfridge, Boise, ID (US)

(73) Assignee: Aptina Imaging Corporation, George Town (KY)

(*) Notice: Subject to any disclaimer, the term of this patent is extended or adjusted under 35 U.S.C. 154(b) by 0 days.

(21) Appl. No.: 13/112,871

(22) Filed: May 20, 2011

(65) Prior Publication Data
US 2012/0193741 A1   Aug. 2, 2012

Related U.S. Application Data

(60) Provisional application No. 61/438,225, filed on Jan. 31, 2011.

(51) Int. Cl.
| H01L 21/00 | (2006.01) |
| H01L 31/0203 | (2014.01) |
| H01L 31/0224 | (2006.01) |
| H01L 27/146 | (2006.01) |

(52) U.S. Cl.
CPC ..... *H01L 31/0203* (2013.01); *H01L 31/022408* (2013.01); *H01L 27/14618* (2013.01)
USPC .............................. 438/66; 438/67; 257/228

(58) Field of Classification Search
CPC .......................... H01L 31/02; H01L 27/14618
USPC ...................................... 257/228; 438/66, 67
See application file for complete search history.

(56) References Cited

U.S. PATENT DOCUMENTS

| 4,901,129 | A | 2/1990 | Hynecek |
| 5,424,223 | A | 6/1995 | Hynecek |
| 5,625,210 | A | 4/1997 | Lee et al. |
| 5,892,288 | A * | 4/1999 | Muraki et al. ................ 257/778 |
| 6,169,319 | B1 * | 1/2001 | Malinovich et al. .......... 257/447 |
| 6,657,665 | B1 | 12/2003 | Guidash |
| 7,566,944 | B2 * | 7/2009 | Wang et al. ................... 257/459 |
| 2008/0224192 | A1 * | 9/2008 | England et al. ............... 257/294 |
| 2009/0124038 | A1 * | 5/2009 | Tuttle .............................. 438/70 |

OTHER PUBLICATIONS

Hynecek, U.S. Appl. 13/008,784, filed Jan. 19, 2011.

* cited by examiner

*Primary Examiner* — Kimberly Rizkallah
*Assistant Examiner* — Alexander Belousov
(74) *Attorney, Agent, or Firm* — Treyz Law Group; Jennifer Luh

(57) ABSTRACT

Methods for forming backside illuminated (BSI) image sensors having metal redistribution layers (RDL) and solder bumps for high performance connection to external circuitry are provided. In one embodiment, a BSI image sensor with RDL and solder bumps may be formed using a temporary carrier during manufacture that is removed prior to completion of the BSI image sensor. In another embodiment, a BSI image sensor with RDL and solder bumps may be formed using a permanent carrier during manufacture that partially remains in the completed BSI image sensor. A BSI image sensor may be formed before formation of a redistribution layer on the front side of the BSI image sensor. A redistribution layer may, alternatively, be formed on the front side of an image wafer before formation of BSI components such as microlenses and color filters on the back side of the image wafer.

9 Claims, 28 Drawing Sheets

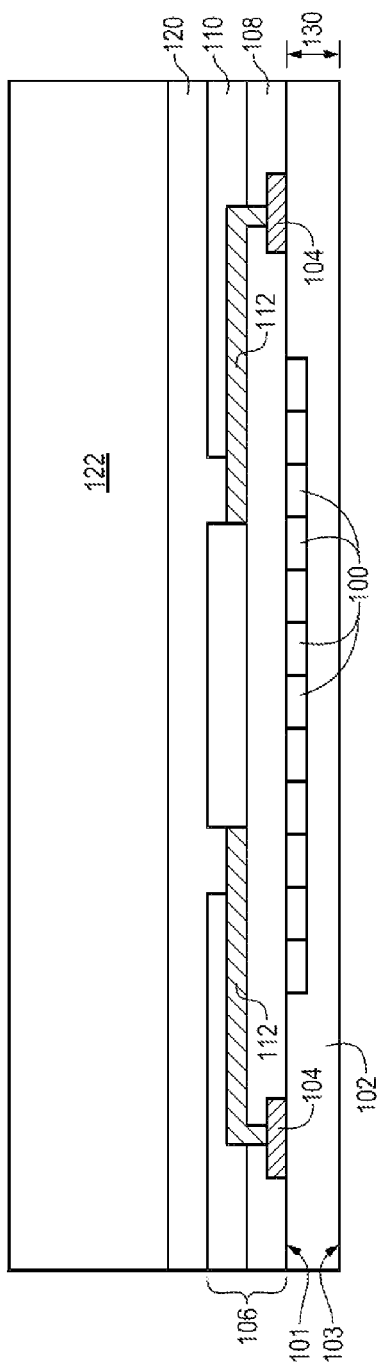
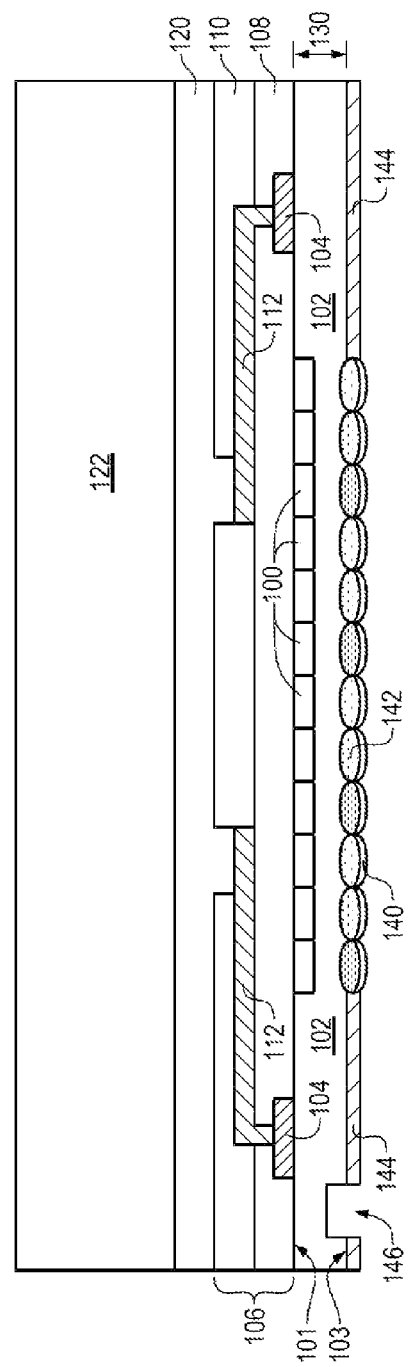

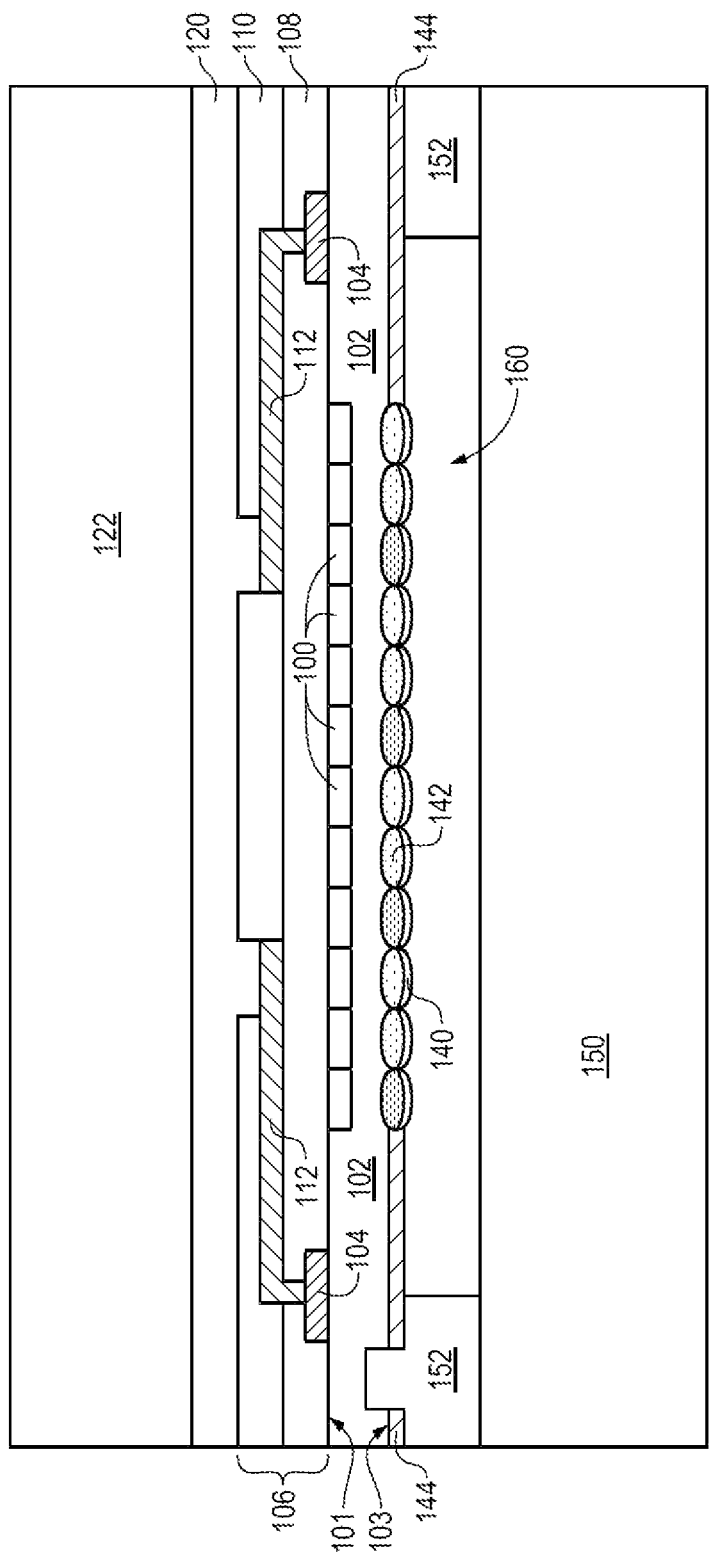

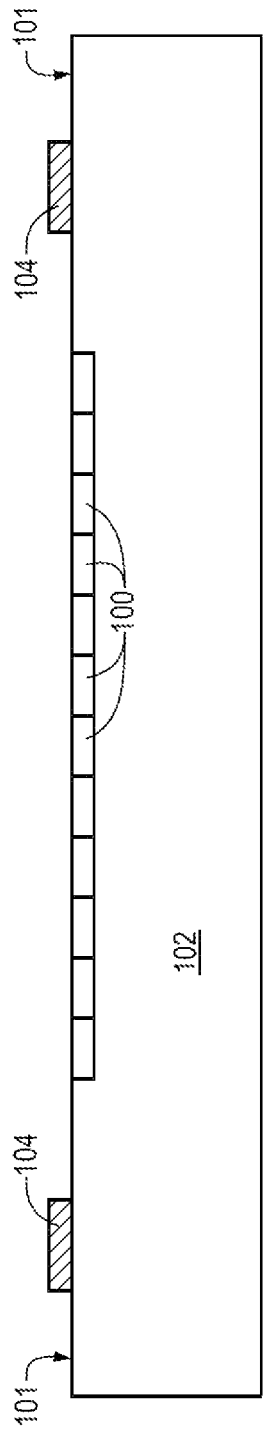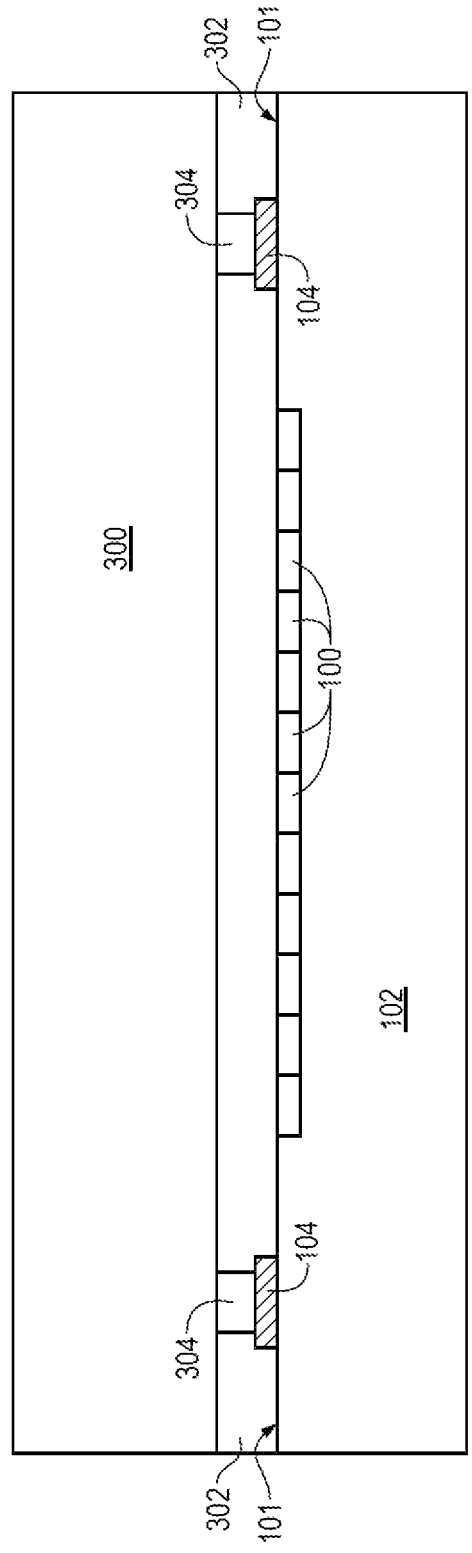

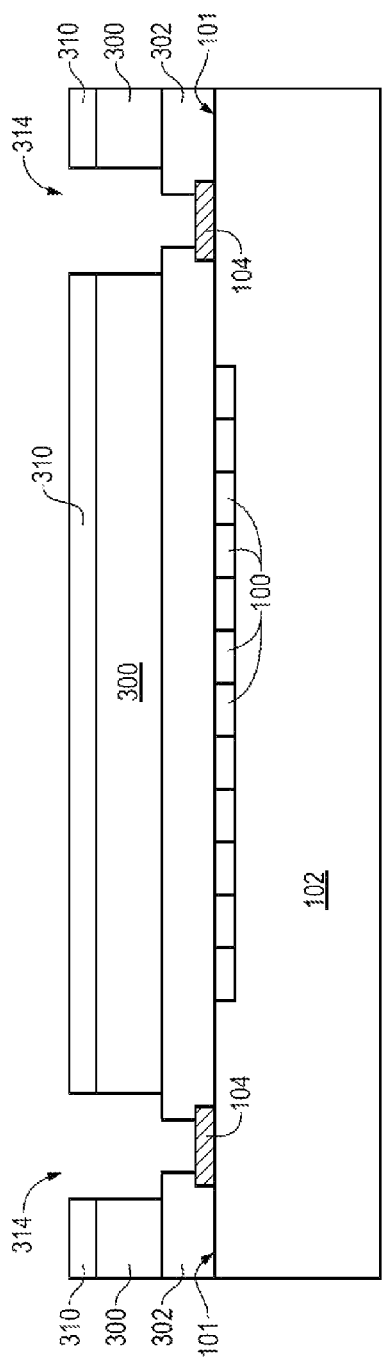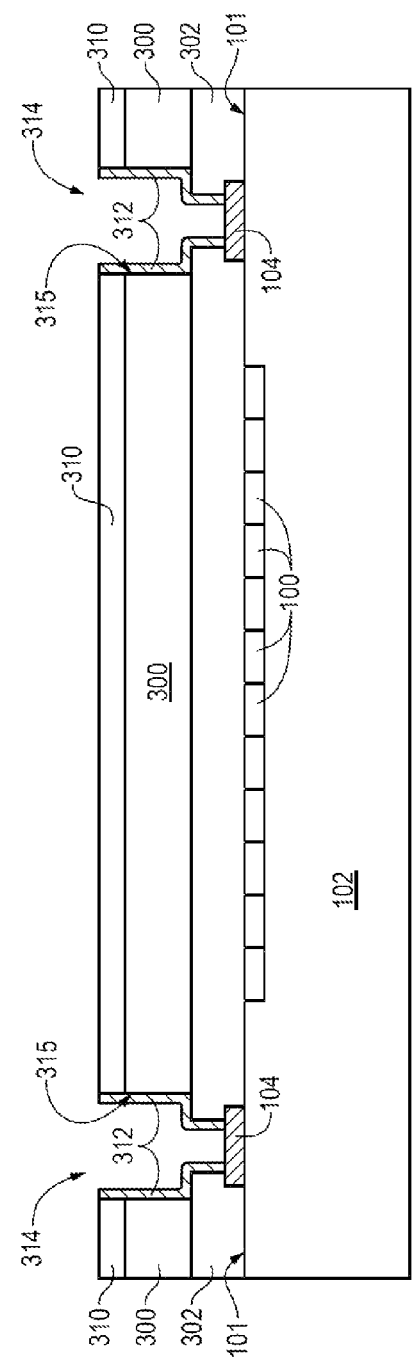

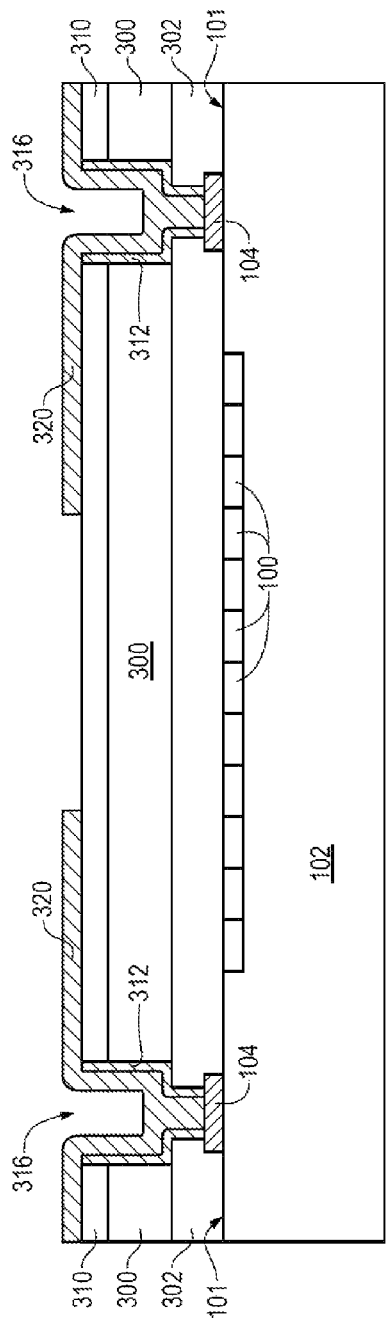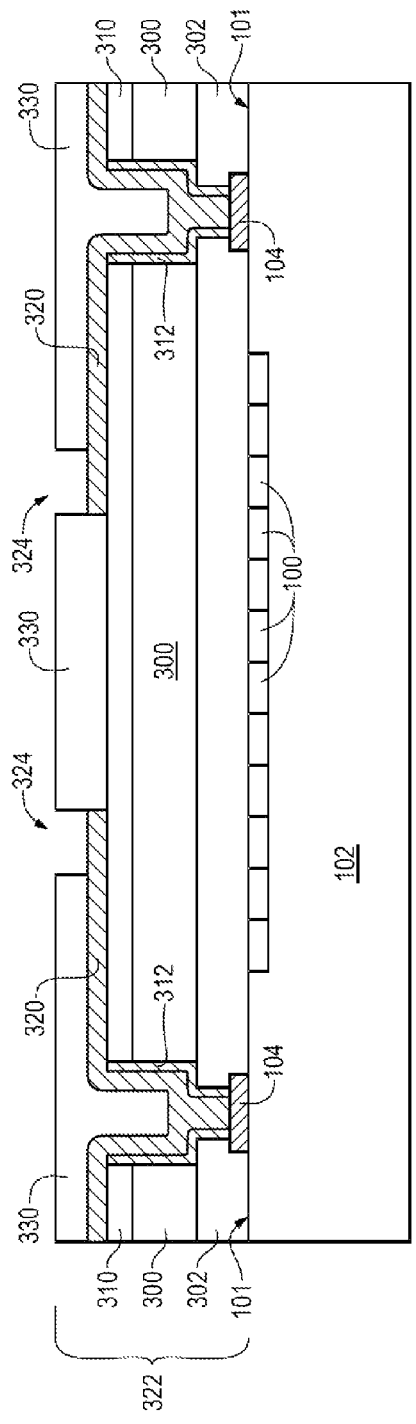

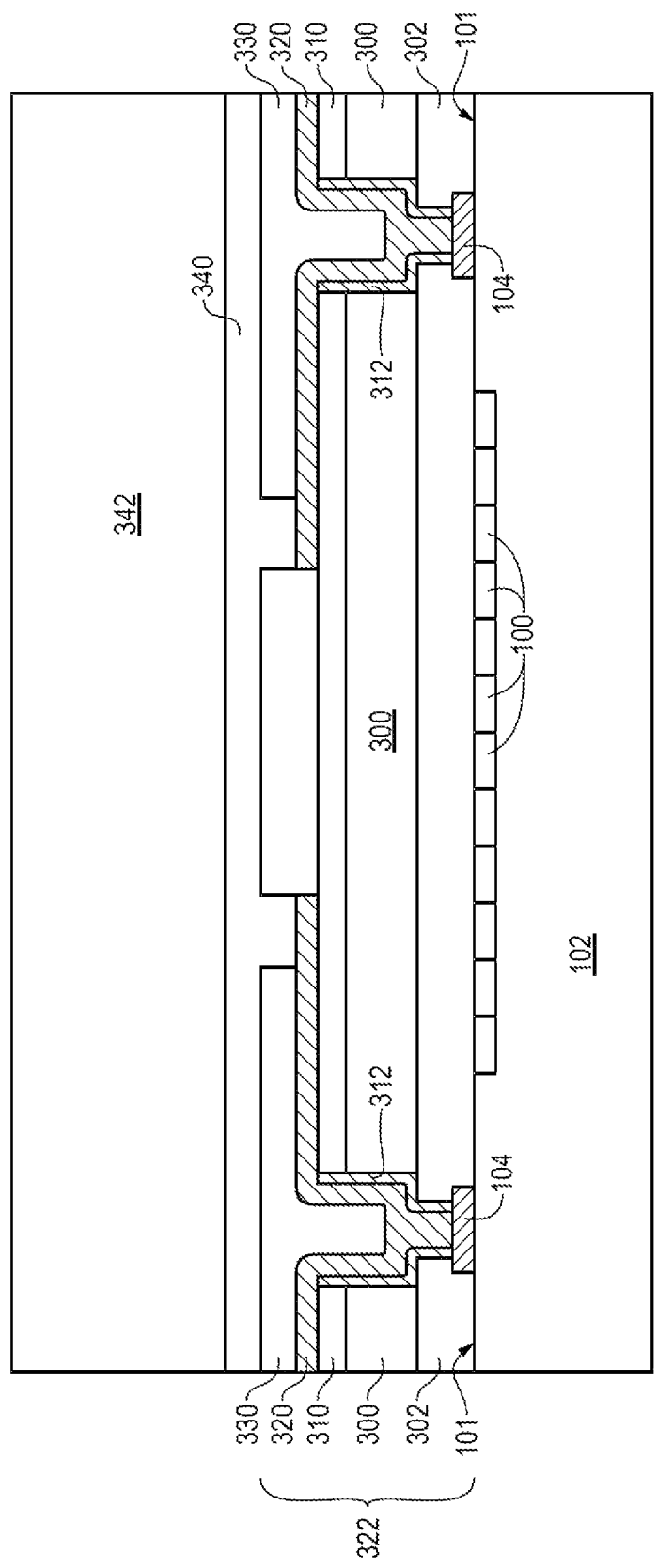

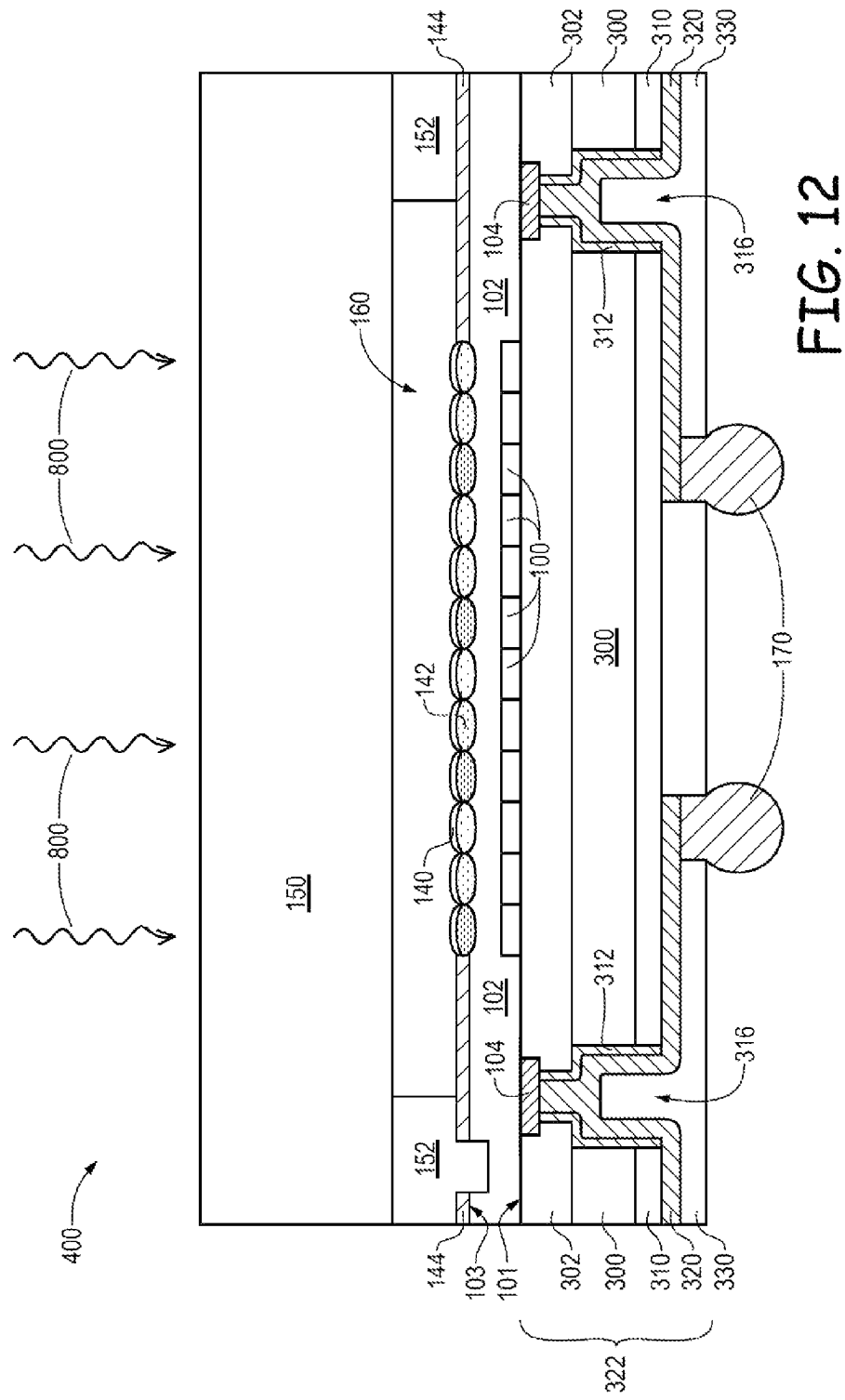

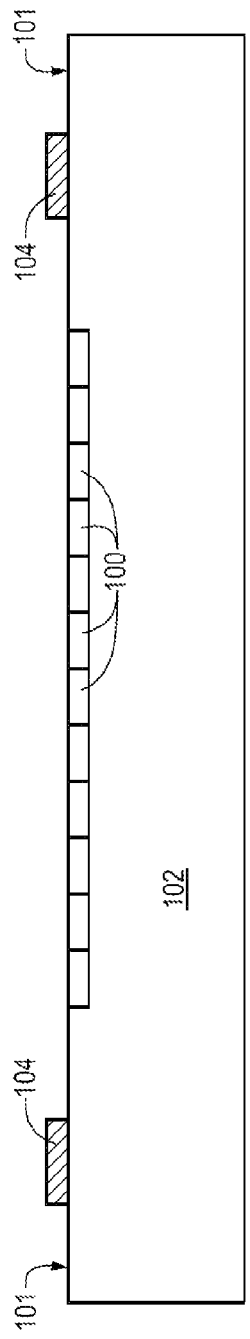
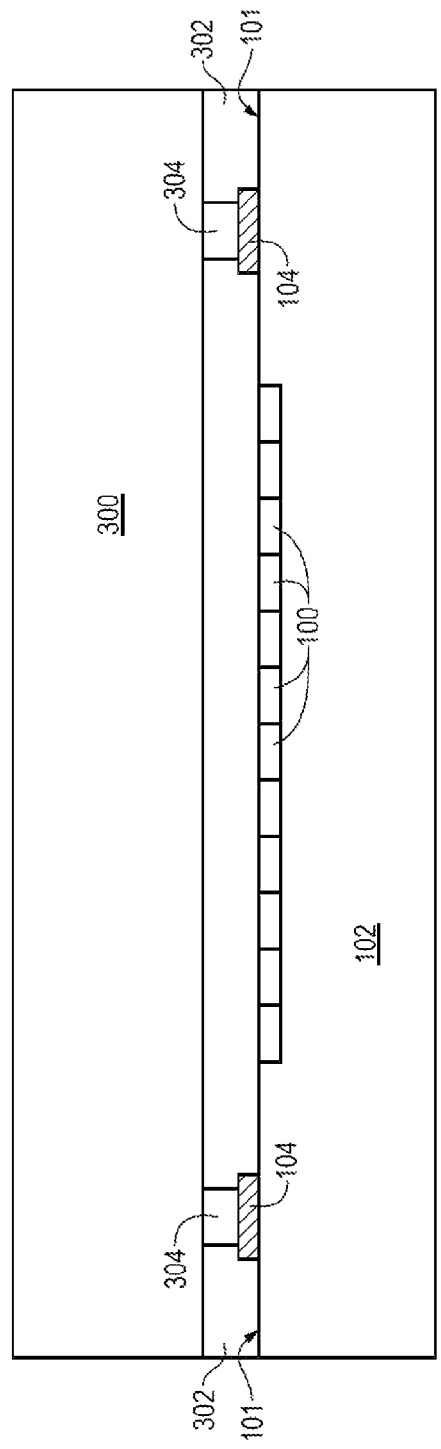

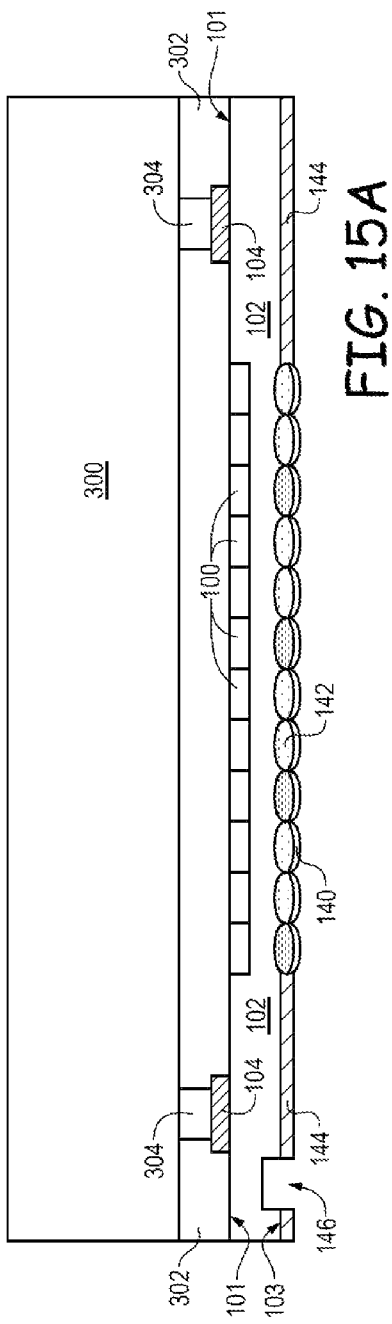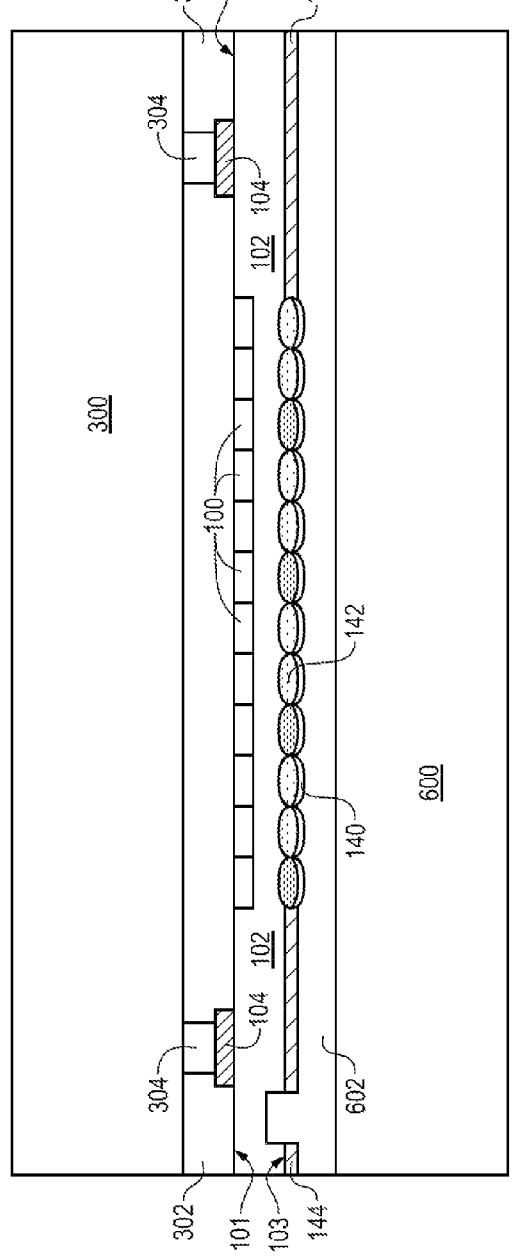

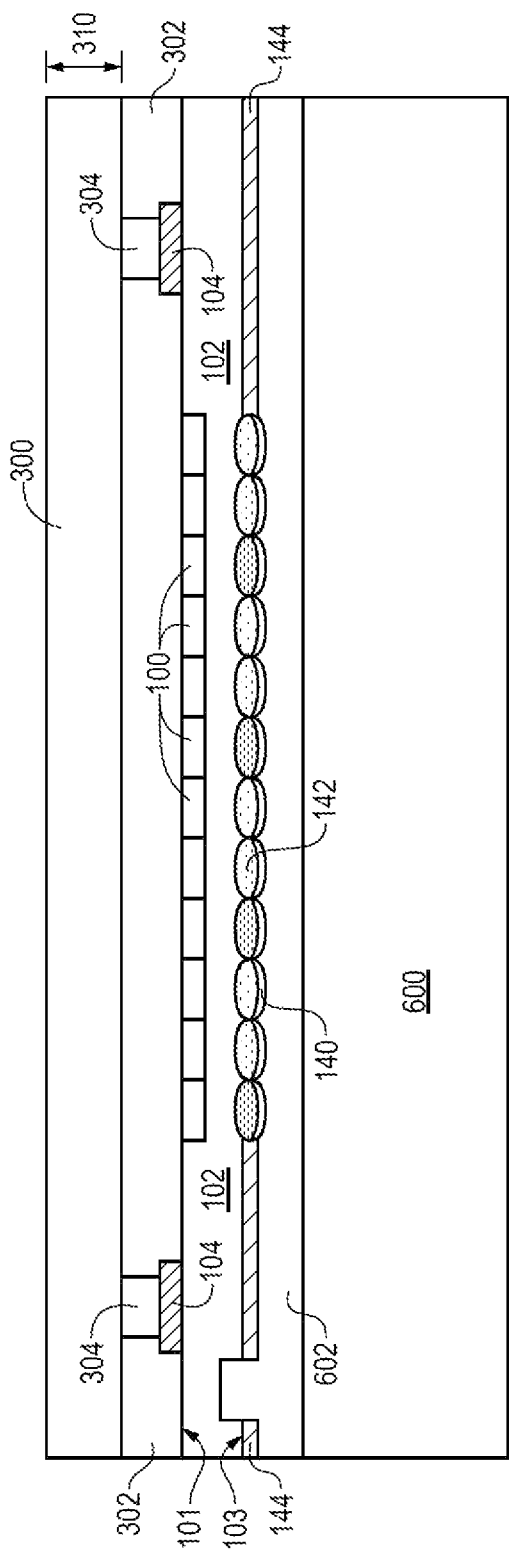

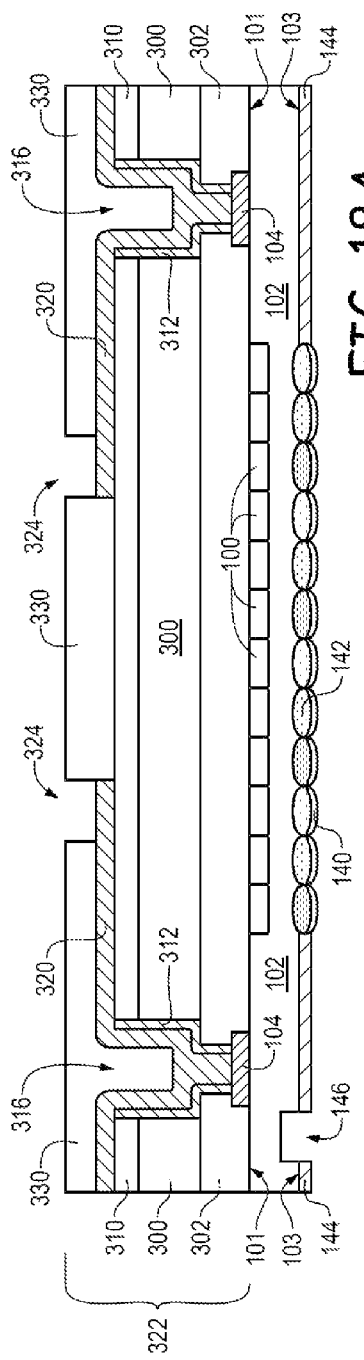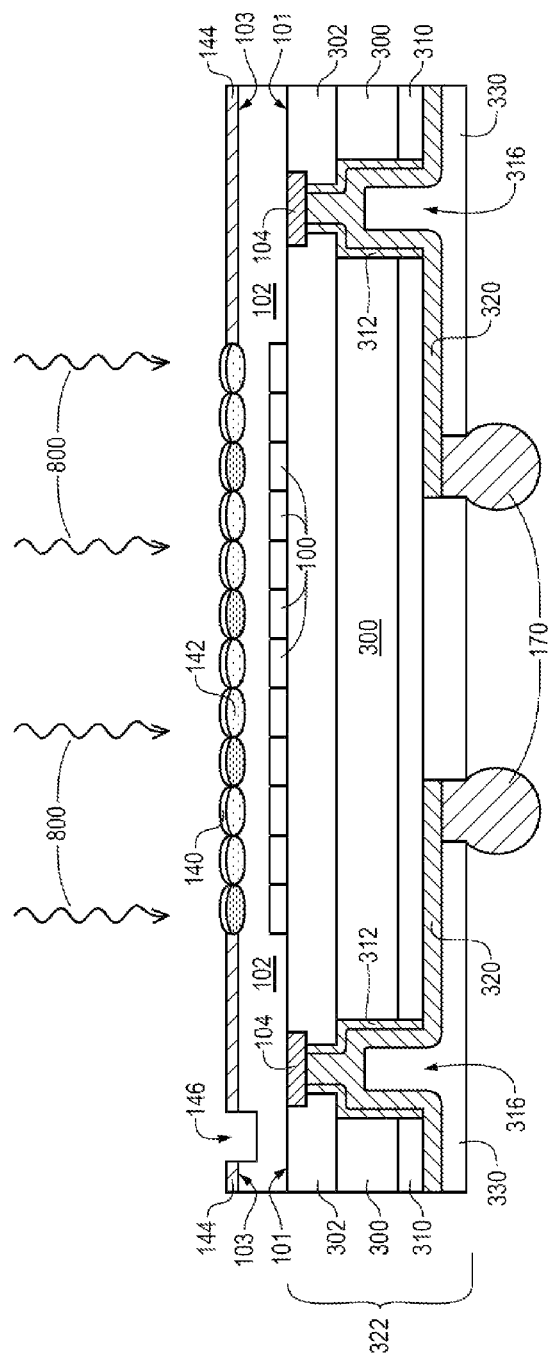

METHODS FOR FORMING BACKSIDE ILLUMINATED IMAGE SENSORS WITH FRONT SIDE METAL REDISTRIBUTION LAYERS

This application claims the benefit of provisional patent application No. 61/438,225, filed Jan. 31, 2011, which is hereby incorporated by reference herein in its entirety.

BACKGROUND

This relates generally to imaging devices, and more particularly, to imaging devices having backside illuminated image sensors with redistribution layers.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A dielectric stack is formed on the front surface of the substrate directly on top of the photodiodes. The dielectric stack includes metal routing lines and metal vias formed in dielectric material.

A color filter array is formed over the dielectric stack to provide each pixel with sensitivity to a certain range of wavelengths. Microlenses may be formed over the color filter array. Light enters from a front side of the image sensor (i.e., light enters the microlenses and travels through the color filters into the dielectric stack). An image sensor used in this way is referred to as a frontside illumination (FSI) image sensor. Because the light must pass through the metal routing lines and metal vias of the dielectric stack in an FSI image sensor, internal reflections within the dielectric stack may cause cross-talk between neighboring image sensors. The size of photosensitive elements in an FSI image sensor is limited due to the space required for routing lines, etc. in the dielectric stack in front of the photosensitive elements.

To address these issues, backside illumination (BSI) image sensors have been developed. In conventional BSI image sensors, microlenses may be formed on the back surface of the substrate on the opposite side of the photodiodes from the dielectric stack. In a typical arrangement, a color filter array is formed under the microlenses on the back surface of the substrate to provide each pixel with sensitivity to a certain range of wavelengths. Light enters from the back side of the image sensor (i.e., light enters the microlenses and travels through the color filters onto the photodiodes).

In a conventional BSI image sensor, metal routing lines are coupled to bond pads on the front side of the dielectric stack. Bond pads are coupled to external circuitry with wire bonds. Lower cost, higher efficiency manufacturing and compact packaging of BSI imager sensors may be achieved by coupling bond pads to external circuitry using solder balls attached to the front surface of a thinned semiconductor substrate in a wafer level packaging process, prior to singulation of the wafer into individual die.

It would therefore be desirable to provide a method of forming a ball grid array on the front side of a BSI image sensor capable of handing thinned semiconductor substrates for wafer level packaging.

BRIEF DESCRIPTION OF THE DRAWINGS

FIG. 3A is a cross-sectional side view of the illustrative image wafer of FIG. 2C after thinning the image wafer in accordance with an embodiment of the present invention.

FIG. 3B is a cross-sectional side view of the illustrative image wafer of FIG. 3A after formation of backside illumination elements on the back side in accordance with an embodiment of the present invention.

FIG. 4A is a cross-sectional side view of the illustrative image wafer of FIG. 3B after attaching a cover layer on the back side in accordance with an embodiment of the present invention.

FIG. 7A is a cross-sectional side view of an illustrative image wafer for use in a backside illuminated image sensor having a redistribution layer and solder bumps in accordance with an embodiment of the present invention.

FIG. 7B is a cross-sectional side view of the illustrative image wafer of FIG. 7A after attaching a permanent carrier on the front side in accordance with an embodiment of the present invention.

FIG. 8A is a cross-sectional side view of the illustrative image wafer of FIG. 7C after formation of a first passivation layer on the permanent carrier in accordance with an embodiment of the present invention.

FIG. 8B is a cross-sectional side view of the illustrative image wafer of FIG. 8A after formation of a second passivation layer in openings in the first passivation layer and the permanent carrier in accordance with an embodiment of the present invention.

FIG. 9A is a cross-sectional side view of the illustrative image wafer of FIG. 8B after formation of a metallization layer in accordance with an embodiment of the present invention.

FIG. 9B is a cross-sectional side view of the illustrative image wafer of FIG. 9A having a redistribution layer on the permanent carrier in accordance with an embodiment of the present invention.

FIG. 10A is a cross-sectional side view of the illustrative image wafer of FIG. 9B after attaching a temporary carrier to the redistribution layer in accordance with an embodiment of the present invention.

FIG. 12 is a cross-sectional side view of an illustrative backside illuminated image sensor having a redistribution layer and solder bumps in accordance with an embodiment of the present invention.

FIG. 14A is a cross-sectional side view of an illustrative image wafer for use in a backside illuminated image sensor having a redistribution layer and solder bumps in accordance with an embodiment of the present invention.

FIG. 14B is a cross-sectional side view of the illustrative image wafer of FIG. 14A after attaching a permanent carrier on the front side in accordance with an embodiment of the present invention.

FIG. 15A is a cross-sectional side view of the illustrative image wafer of FIG. 14C after formation of backside illumination elements on the back side of the image wafer in accordance with an embodiment of the present invention.

FIG. 15B is a cross-sectional side view of the illustrative image wafer of FIG. 15A after attaching a temporary carrier to the back side of the image wafer in accordance with an embodiment of the present invention.

FIG. 15C is a cross-sectional side view of the illustrative image wafer of FIG. 15B after thinning the permanent carrier in accordance with an embodiment of the present invention.

FIG. 18A is a cross-sectional side view of the illustrative image wafer of FIG. 17B after detaching the temporary carrier from the image wafer in accordance with an embodiment of the present invention.

FIG. 18B is a cross-sectional side view of an illustrative backside illuminated image sensor having a redistribution layer and solder bumps in accordance with an embodiment of the present invention.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image pixels. The pixels in the image sensors may include photosensitive elements such as photodiodes that convert the incoming light into digital data. Image sensors may have any number of pixels (e.g., hundreds or thousands or more). A typical image sensor may, for example, have millions of pixels (e.g., megapixels).

Figure 1:
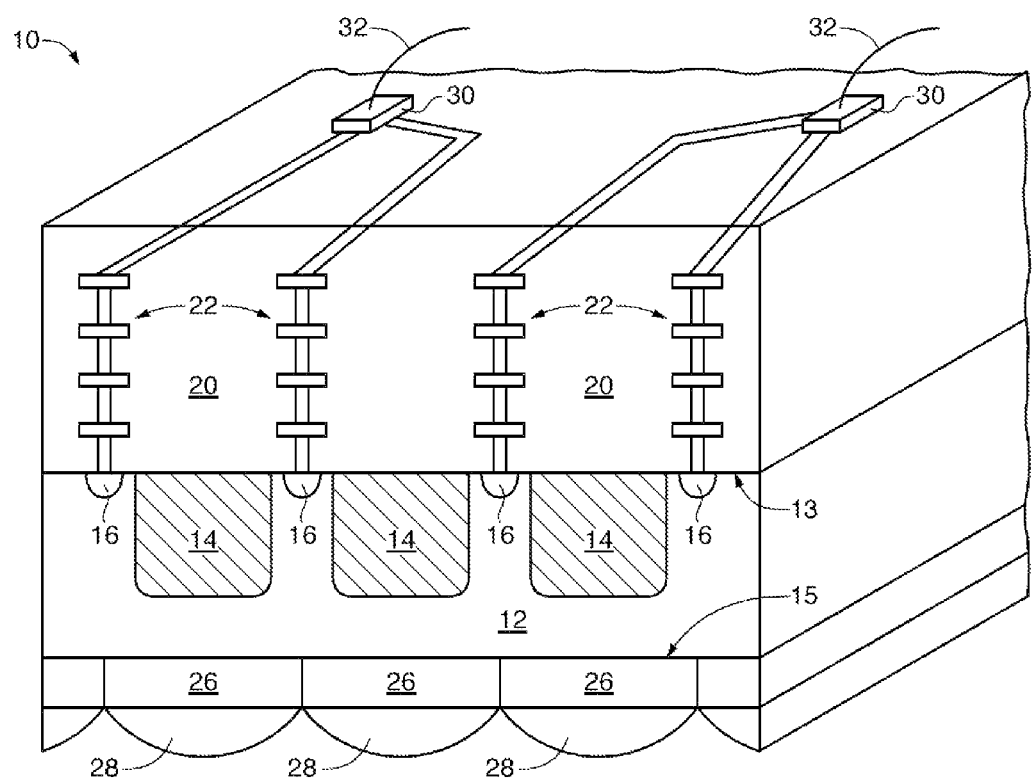
FIG. 1 is a cross-sectional side view of a conventional backside illumination image pixel array.

FIG. 1 is a cross-sectional side view of an image pixel array 10. Pixel array 10 includes conventional backside illumination image pixels arranged in an array. Each pixel has a photodiode 14 formed in a front side of a silicon substrate 12. Each pixel also has an associated floating diffusion region 16 formed in the front side of substrate 12.

A dielectric stack 20 is formed on front surface 13 of substrate 12. Dielectric stack 20 includes metal interconnect structures 22 formed in dielectric material (e.g., silicon dioxide). Metal interconnect structures may include metal routing lines and metal vias in the interlevel dielectric (ILD) layers. Conductive bond pads 30 are formed on dielectric stack 20 and coupled to interconnect structures 22.

A color filter array 26 is formed on back surface 15 of substrate 12. A respective microlens 28 covers each color filter pixel element 26. Light can enter from the back side of the image pixels through microlenses 28. The incoming light is absorbed by photodiode 14. Conventional BSI image sensors such as pixel array 10 are coupled to external circuitry using wire bonds such as wire bonds 32. Wire bonds 32 may be electrically coupled to bond pads 30.

Figure 2A:
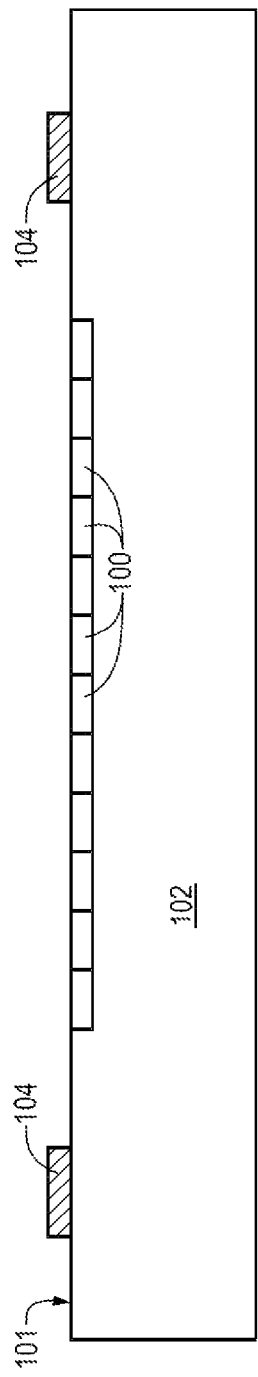
FIG. 2A is a cross-sectional side view of an illustrative image wafer for use in a backside illuminated image sensor having a redistribution layer and solder bumps in accordance with an embodiment of the present invention.
Figure 2B:
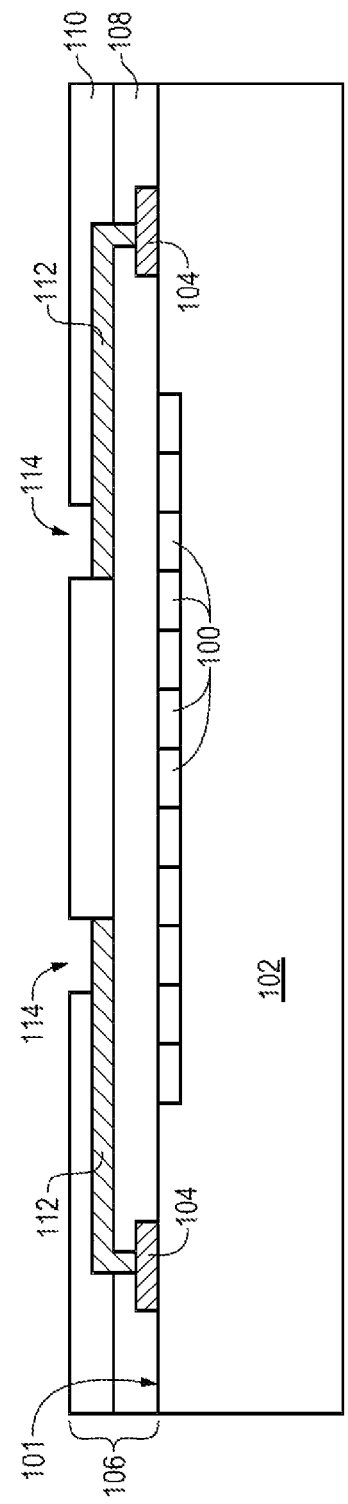
FIG. 2B is a cross-sectional side view of the illustrative image wafer of FIG. 2A after formation of a redistribution layer on the front side in accordance with an embodiment of the present invention.
Figure 2C:
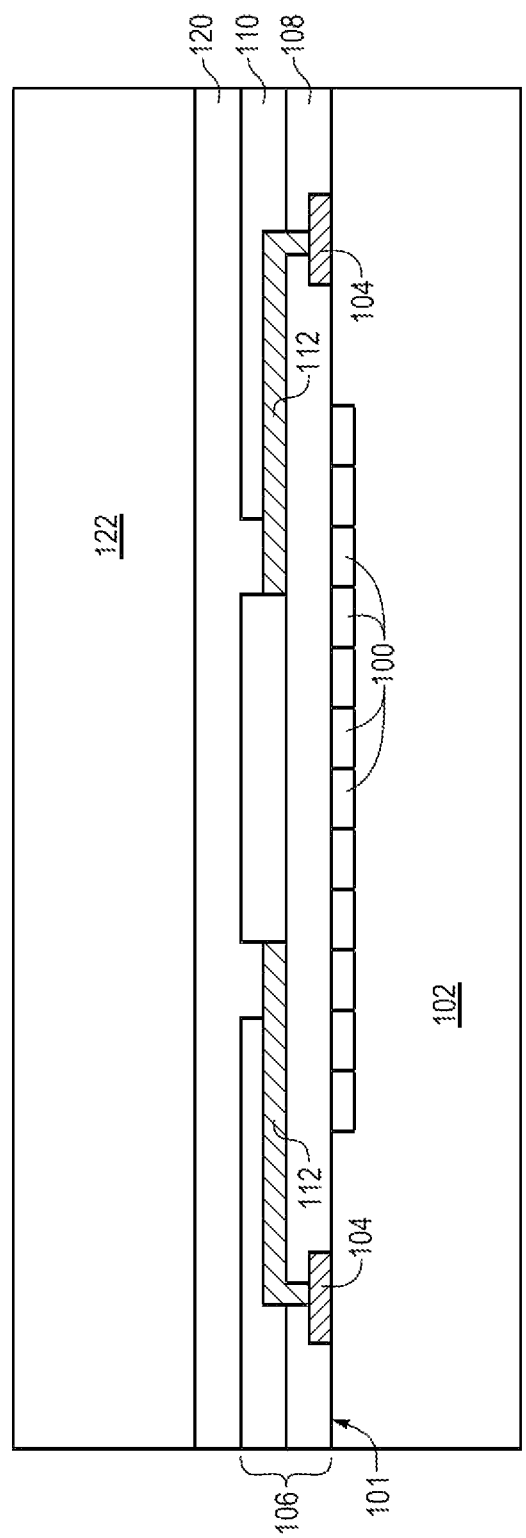
FIG. 2C is a cross-sectional side view of the illustrative image wafer of FIG. 2B with a temporary carrier attached to the redistribution layer in accordance with an embodiment of the present invention.

FIGS. 2A, 2B, and 2C are cross-sectional side views of an illustrative BSI image sensor having a metal redistribution layer for providing solder bumps for connecting to external circuitry in various manufacturing stages. As shown in FIG. 2A, a semiconductor substrate (e.g., a silicon wafer, also sometimes referred to as an image wafer) such as substrate 102 may be provided with conductive bond pads 104 and image pixels 100. Image pixels 100 may include a photosensor, a floating diffusion region, readout circuitry, etc. Image pixels 100 may be formed on a side of a semiconductor substrate such as front side 101 of semiconductor substrate 102. Semiconductor substrate 102 may also have control circuitry formed on front side 101.

Conductive bond pads 104 may be formed from aluminum, copper or other suitable conductive material. As shown in FIG. 2B, a redistribution layer (RDL) such as redistribution layer 106 may be formed on front side 101 of image wafer 102. RDL layer 106 may be provided to reposition the electrical contacts of an image sensor (e.g., to provide electrical contacts such as contacts 114 at a different location from the location of bond pads 104 for coupling to external circuitry). RDL layer 106 may be comprised of one or more patterned passivation layers such as dielectric layers 108 and 110 of RDL layer 106. Dielectric layers 108 and 110 may be formed form any suitable dielectric (e.g., nitride, polyimide or other suitable materials).

A first dielectric layer such as dielectric layer 108 may be patterned so as to have openings over bond pads 104. RDL 106 may also include patterned metallization layer such as metallization layer 112. Metallization layer may be formed from any suitable conductive material or combination of conductive materials (e.g., titanium, copper, nickel, palladium etc.). Metallization layer 112 may be patterned to contact bond pads 104 through openings in dielectric layer 108. Metallization layer 112 may run along the front surface of dielectric layer 108 as shown in FIG. 2B. RDL 106 may also include a second patterned dielectric layer such as dielectric layer 110 formed on top of dielectric layer 108 and metallization layer 112. Dielectric layer 110 may be patterned having openings such as openings 114 that provide electrical contact with metallization layer 112 and bond pads 104. Openings 114 may provide electrical contacts for an image sensor in a redistributed pattern with respect to the pattern of bond pads 104.

As shown in FIG. 2C, a temporary carrier such as carrier 122 may be attached to the front side of redistribution layer 106 using a temporary adhesive layer such as adhesive layer 120. Carrier 122 may be made from silicon, another material or a combination of other suitable materials.

FIG. 3A and FIG. 3B are cross-sectional side views of an illustrative BSI image sensor having a metal redistribution layer for providing solder bumps for connecting to external circuitry in two later manufacturing stages. As shown in FIG. 3A, semiconductor substrate 102 may be thinned to a thickness 130 suitable for an image sensor array. Thinning of image wafer 102 to thickness 130 may be done by any suitable method (e.g., back grinding, polishing, wet etching, dry etching, etc.) Thickness 130 of thinned semiconductor substrate 130 may, as an example, be between 2.0 microns and 2.5 microns, may be less than 2.0 microns or may be larger than 2.5 microns. Once thinned, image wafer 102 may have a back side such as back side 103 of FIG. 3A.

As shown in FIG. 3B, following thinning of image wafer 102 to desired thickness 130, a backside illumination and color filter array processing step is performed. In a typical backside illumination process, a doped silicon layer may be deposited on back side 103 of image wafer 102. Following deposition of the doped silicon layer, the doped silicon layer may be laser annealed using laser radiation of ultraviolet to blue color. Laser annealing may be accomplished with other colors of laser light such as red laser light, etc. Laser annealing of the doped silicon layer produces a doped region near back side 103 of image wafer 102. Additional layers such as antireflective layers may be deposited on back side 103 of image wafer 102.

A color filter array having color filters 142 may be formed on back surface 103 of substrate 102. Each color filter 142 may serve to filter incoming light for a respective image pixel 100. Color filters 142 may include green filters, red filters, blue filters, yellow filters, cyan filters, magenta filters, or other types of filters. As an example, a green filter passes green light (e.g., light with wavelengths from 495 nm to 570 nm) and reflects and/or absorbs light out of that range (e.g., the green filter reflects red light and blue light).

An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

An array of microlenses such as microlenses 140 may be formed on each respective color filter 142 from the back side of image wafer 102. Each microlens may be used to concentrate incoming light onto one associated image pixels 100. As shown in FIG. 3B, a portion of back side 103 of image wafer 102 may be coated in a light blocking material such as light blocking material 144 (i.e., a material that absorbs infrared and visible wavelengths of light). If needed, alignment marks 146 may be opened in the silicon to align backside elements such as microlenses 140 and color filters 142 with frontside elements such as image pixels 100.

Figure 4B:
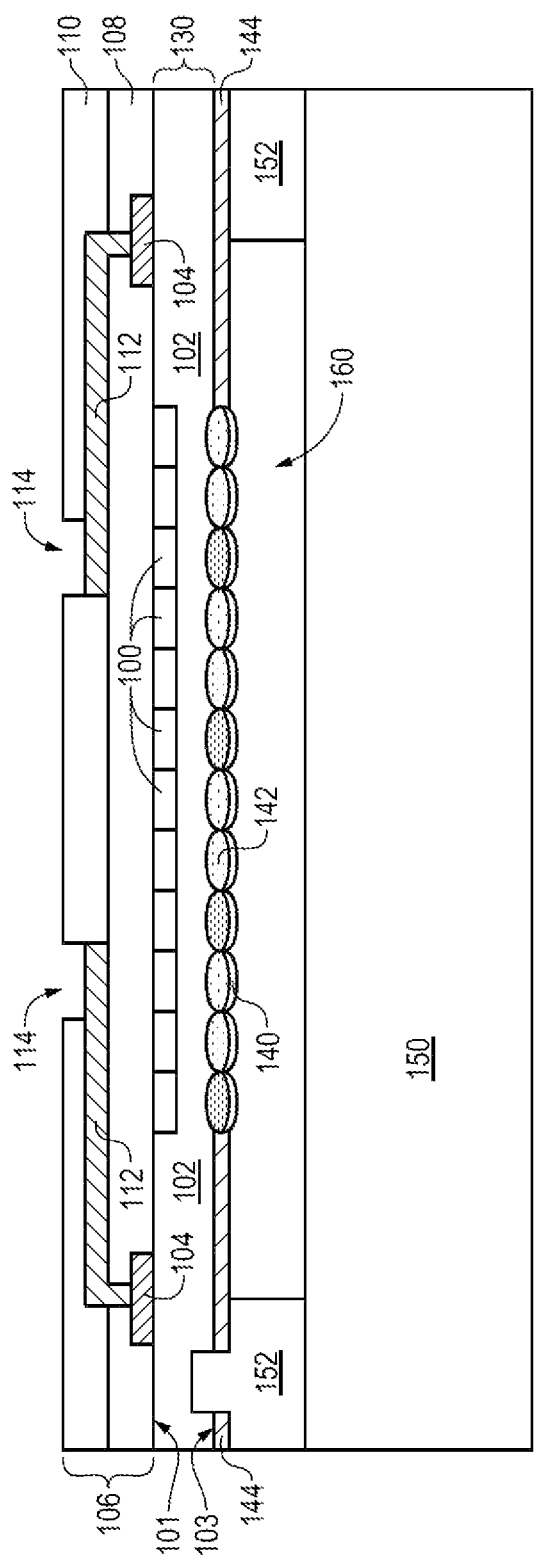
FIG. 4B is a cross-sectional side view of the illustrative image wafer of FIG. 4A after detaching the temporary carrier in accordance with an embodiment of the present invention.

FIG. 4A and FIG. 4B are cross-sectional side views of an illustrative BSI image sensor having a metal redistribution layer for providing solder bumps for connecting to external circuitry in two even later manufacturing stages. As shown in FIG. 4A, a rigid cover layer such as cover layer 150 is mounted over the array of color filters 142. In mounting cover layer 150, a photo-definable dry film adhesive layer such as dry film adhesive 152 is applied to back side 103 of image wafer 102 covering microlenses 140 and color filters 142. Portions of dry film adhesive 152 in the vicinity of microlenses 140 and color filters 142 are then removed (i.e., photo-defined) to provide opening 160 over the array of microlenses 140. Cover layer 150 may then be attached to the remaining portions of dry film adhesive 152.

As shown in FIG. 4B, temporary carrier 122 may then be removed. Carrier 122 may be removed by thermal shear de-bonding, mechanical twist de-bonding or other suitable de-bonding methods. Following removal of carrier 122, remaining adhesive 120 may be removed using, as an example, a chemical solvent (e.g., IPA and acetone).

Figure 5:
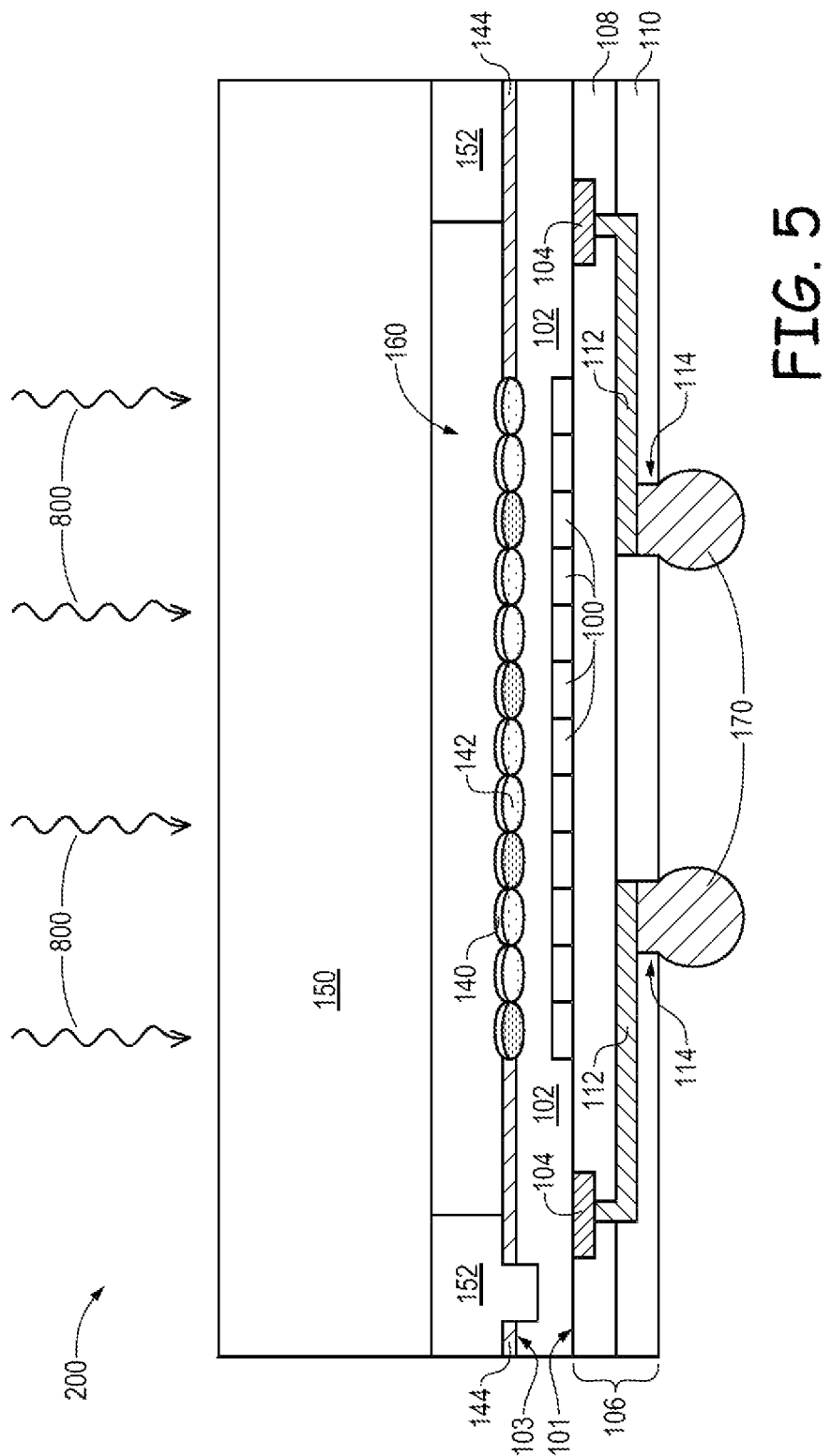
FIG. 5 is a cross-sectional side view of an illustrative backside illuminated image sensor having a redistribution layer and solder bumps in accordance with an embodiment of the present invention.

FIG. 5 is cross-sectional a side view of an illustrative BSI image sensor having a metal redistribution layer and solder bumps for connecting to external circuitry in its final manufacturing stage. Following removal of carrier 122 and adhesive 120 as described in connection with FIG. 4B, solder bumps 170 may, if desired, be attached to image sensor 200. BSI image sensor 200 may be provided without solder balls 170 allowing a user of BSI image sensor 200 to form wire bonds, metal bonds or other electrical contacts in contact with metallization layer 112 in openings 114. Attaching solder bumps 170 (sometime referred to herein as solder balls) to image sensor 200 may be performed by screen printing solder paste into openings 114 in dielectric layer 110 onto metallization layer 112. Solder bumps 170 are then formed by reflowing (i.e., heating until melted) the solder paste to form solder balls. Alternatively, solder balls may be formed in openings 114 using ball drop, solder shooting, or other solder deposition methods. The wafer is then singulated into individual dies. The completed backside illuminated image sensor 200 having solder balls 170, as shown in the example of FIG. 5, includes a cover layer 150. Cover layer 150 may be formed from glass, plastic or other suitably transparent material. Cover layer 150 is mounted to dry film adhesive 152. Dry film adhesive 152 attaches cover layer 150 to back side 103 of image wafer 102.

In the final configuration shown (as an example) in FIG. 5, image wafer 102 includes control circuitry and an array of image pixels 100 on a front side and an associated array of color filters 142 and an associated array of microlenses 140 on a back side. Image light 800 may be received through cover layer 150, microlenses 140 and color filters 142 on back side 103 of image wafer 102 before being absorbed by image pixels 100 mounted on front side 101 of image wafer 102. Behind image pixels 100, a redistribution layer such as redistribution layer 106 may be mounted to front side 101 of image wafer 102. Redistribution layer 106 may include dielectric layer 110, metallization layer 112 and photo-definable dielectric layer 108. Dielectric layers 108 and 110 may be formed from a dry film photo-resistive material or a spin-on photo-resistive material, or other suitable dielectric material. The example of FIG. 5 is merely illustrative and other embodiments are possible.

Figure 6:
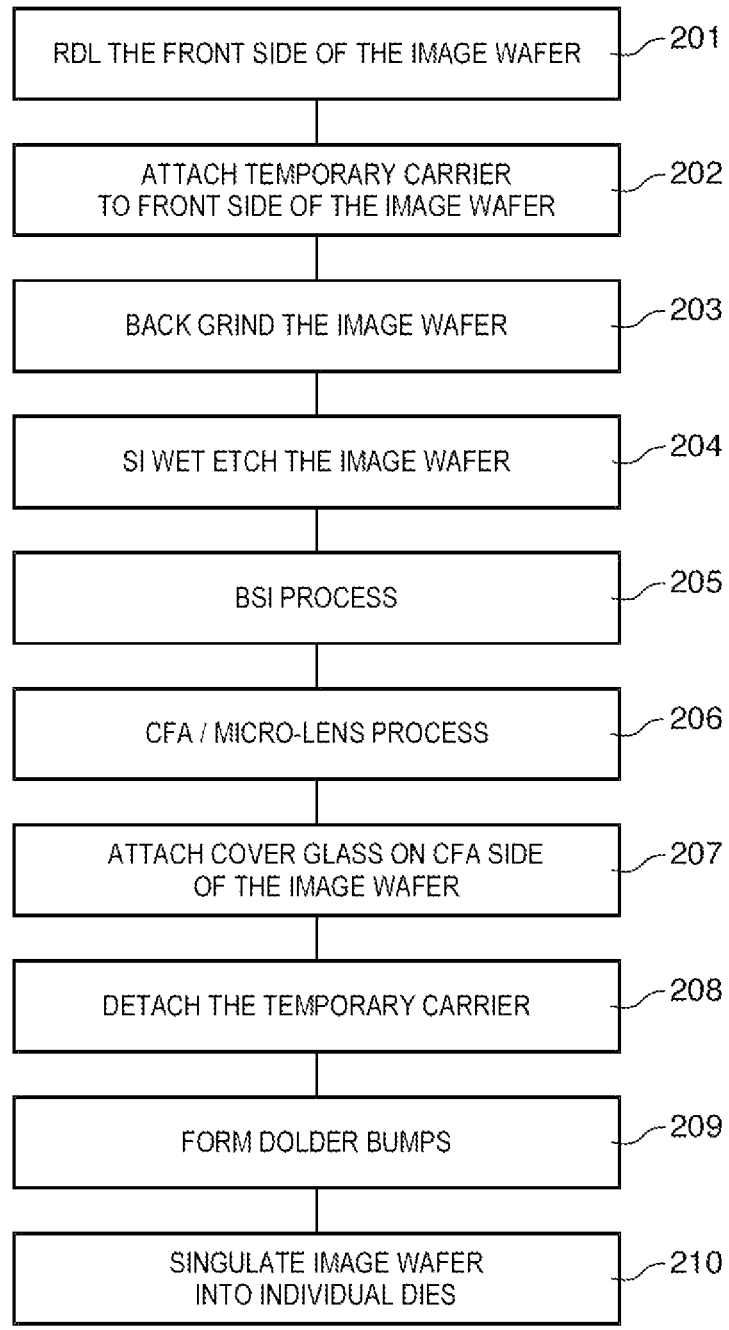
FIG. 6 is a flowchart of illustrative steps for producing a backside illuminated image sensor having a redistribution layer and solder bumps in accordance with an embodiment of the present invention.

FIG. 6 is a flowchart showing illustrative steps for producing BSI image sensors having solder bumps and metal redistribution layers. As shown in FIG. 6, at step 201, a redistribution layer (RDL) is formed on a front side such as front side 101 of an image wafer such as semiconductor substrate 102 of FIG. 2A. At step 202, a temporary carrier is attached to the RDL using an adhesive layer such as adhesive layer 120 of FIG. 2C. At step 203, the image wafer (silicon substrate) is back grinded to a desired thickness such as thickness 130 of FIG. 3A. At step 204, the image wafer may optionally be further thinned using a silicon wet etch. At step 205, a back side of the image wafer such as back side 103 of image wafer 102 of FIG. 3B is further prepared for backside illumination of photosensors on front side 103 of image wafer 102 using a standard BSI process.

As described in connection with FIG. 3B, a standard BSI process may include silicon doping, laser annealing, light block deposition and opening of alignment marks such as alignment marks 146 of FIG. 3B. Following BSI processing, a color filter array (CFA) may be formed on back side 103 of image wafer 102. Microlenses such as microlenses 140 of FIG. 3B may then be formed over the color filter array on back side 103 of image wafer 102. Formation of the color filter array (CFA) and microlenses may sometimes be referred to herein as a CFA/μlens process. Following the CFA/microlens process, at step 207, a cover layer (sometimes referred to as a cover glass) such as cover layer 150 may be attached to back side 103 of image wafer 102 covering color filters 142 of the CFA.

As described in connection with FIG. 4A, cover layer 150 may also be formed from other transparent materials such as plastic. Cover layer 150 may be attached to image wafer 102 using a patterned adhesive film such as patterned dry film adhesive 152 of FIG. 4B. Following attaching cover glass 150, at step 208, the temporary carrier attached in step 202 may be removed using thermal shear or other de-bonding methods. At step 209, solder bumps such as solder bumps 170 of FIG. 5 may, if desired, be formed in openings 114 in order to provide electrical contact with metallization layer 112 of redistribution layer 106 and therefore with bond pads 104. At step 210, the image wafer is singulated into individual dies.

Figure 7C:
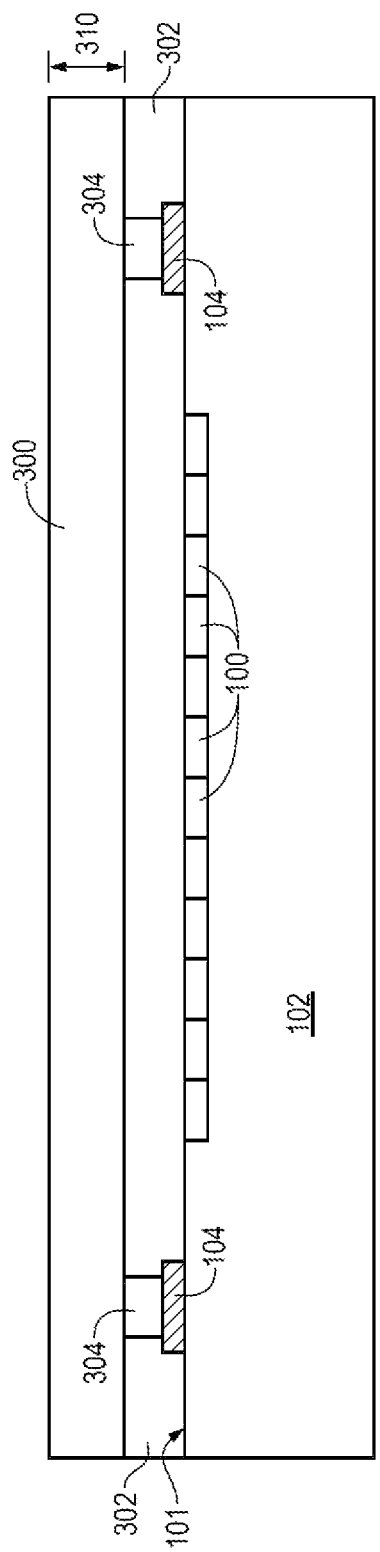
FIG. 7C is a cross-sectional side view of the illustrative image wafer of FIG. 7B after thinning the permanent carrier in accordance with an embodiment of the present invention.

FIGS. 7A, 7B, and 7C are cross-sectional side views of another illustrative embodiment of a BSI image sensor having a metal redistribution layer for providing solder bumps for connecting to external circuitry in various manufacturing stages. As shown in FIG. 7A, as in FIG. 2A, substrate 102 may be provided with conductive bond pads 104 and image pixels 100 formed on front side 101 of semiconductor substrate 102. Semiconductor substrate 102 may also have control circuitry formed on front side 101

As shown in FIG. 7B, a permanent carrier such as carrier 300 may be attached to front side 101 of image wafer 102 using a permanent adhesive layer such as adhesive layer 302. Carrier 300 may be made from silicon, another material or a combination of other suitable materials. Adhesive layer 302 may be formed from a photo-definable dry film adhesive. Adhesive layer 302 may be patterned (i.e., photo-defined) to provide openings 304 in adhesive layer 302 for later access to metal bond pads 104. In an alternative arrangement, carrier 300 may be attached directly to image wafer 102 using an oxide-oxide bonding process (i.e. and oxide layer on carrier 300 may be bonded to a thin layer of oxide applied to image wafer 102). If an oxide-oxide bonding process is used, openings 304 may be formed at a later stage of manufacture than that shown in FIG. 7B. Carrier 300 may also, if desired, be attached to front side 101 of image wafer 102 using another permanent adhesive. Adhesive layer 302 may be spun on, sprayed on, screen printed, dry laminated or may be applied by another suitable process.

As shown in FIG. 7C, following attaching permanent carrier 300 to image wafer 102, carrier 300 may be thinned to a thickness 310. Thickness 310 may be between 80 microns and 100 microns or may be any other thickness that provides strength to the assembly while allowing formation of through-silicon vias as shown in subsequent figures. Carrier 300 may be thinned using any suitable thinning process such as those described in connection with FIG. 3A.

FIGS. 8A, 8B, 9A, and 9B are cross-sectional side views of the illustrative embodiment shown in FIG. 7C, of a BSI image sensor having a metal redistribution layer for providing solder bumps for connecting to external circuitry in later manufacturing stages in which a redistribution layer is added front side 101 of image wafer 102. FIG. 8A shows addition of a first passivation layer such as passivation layer 310 on top of permanent carrier 300. Passivation layer 310 may be formed of any suitable permanent photo-definable dielectric. Permanent photo-definable dielectrics may be thermosetting dielectrics (i.e., dielectrics that cure upon application of heat).

Dielectric layer 310 may, as shown in FIG. 8A, be patterned so as to have openings such as openings 314 over bond pads 104. In the same patterning step, openings 314 may be extended into silicon carrier 310 in order to expose bond pads 104.

As shown in FIG. 8B, a second passivation layer such as passivation layer 312 may be added to sidewalls 315 of openings 314. Passivation layer 312 may be a spin on dielectric, a chemical vapor deposited dielectric or other dielectric. Passivation layer 312 may be formed on sidewalls 315 of opening 314 by spinning on a dielectric then using a photo-defining procedure to remove material from the bottom of openings 314. If passivation layer 312 is not photo-definable, dielectric material may be removed from the bottom of openings 314 using a blanket dry etch process.

FIG. 9A shows a subsequent step in the formation of a RDL on front side 101 of image wafer 102. As shown in FIG. 9A, a patterned metallization layer such as metallization layer 320 may be formed over passivation layer 310. Metallization layer 320 may be formed from any suitable conductive material or combination of conductive materials (e.g., titanium, copper, nickel, palladium etc.). Metallization layer 320 may be patterned to contact bond pads 104 through openings 314 in dielectric layer 312 and silicon carrier 300 forming through-silicon vias such as through-silicon vias 316.

As shown in FIG. 9B, a redistribution layer such as RDL 322 may include a third patterned dielectric layer such as dielectric layer 330 formed on top of dielectric layer 310 and metallization layer 320. Dielectric layer 330 may be patterned having openings such as openings 324 that provide access to metallization layer 320 in order to provide electrical contact bond pads 104. Openings 324 may provide electrical contacts in a redistributed pattern with respect to the pattern of bond pads 104 (i.e., the location of openings 324 define where solder balls will ultimately be placed). Third passivation layer 330 may have light blocking properties (e.g., infrared absorption) in order to prevent light from front side 101 of image wafer 102 from reaching image pixels 100. Passivation layer 330 may be formed from a single dielectric material or may be made of multiple layers including a dry film laminate dielectric and a photo-definable infrared-blocking coating.

In the example of FIG. 9B, redistribution layer 322 includes first passivation layer 310, second dielectric passivation layer 312, metallization layer 320, and third passivation layer 330. RDL 322 may include through-silicon vias 316 through silicon carrier 300.

Figure 10B:
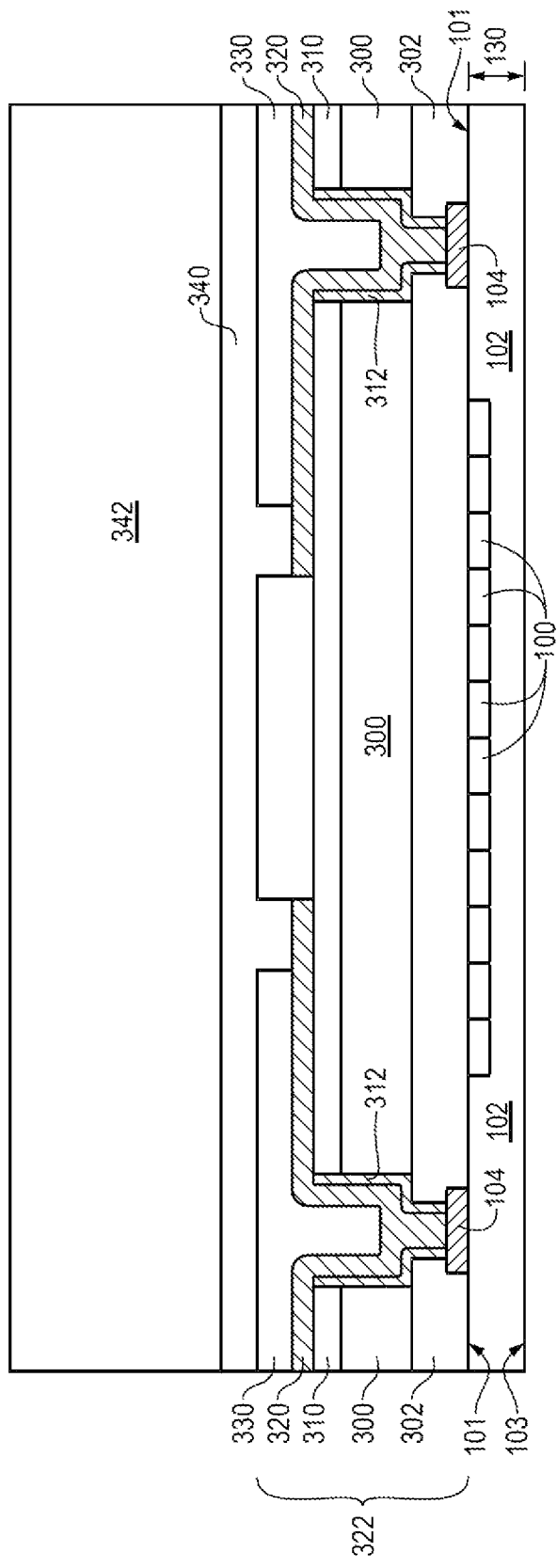
FIG. 10B is a cross-sectional side view of the illustrative image wafer of FIG. 10A after thinning the image wafer in accordance with an embodiment of the present invention.
Figure 11A:
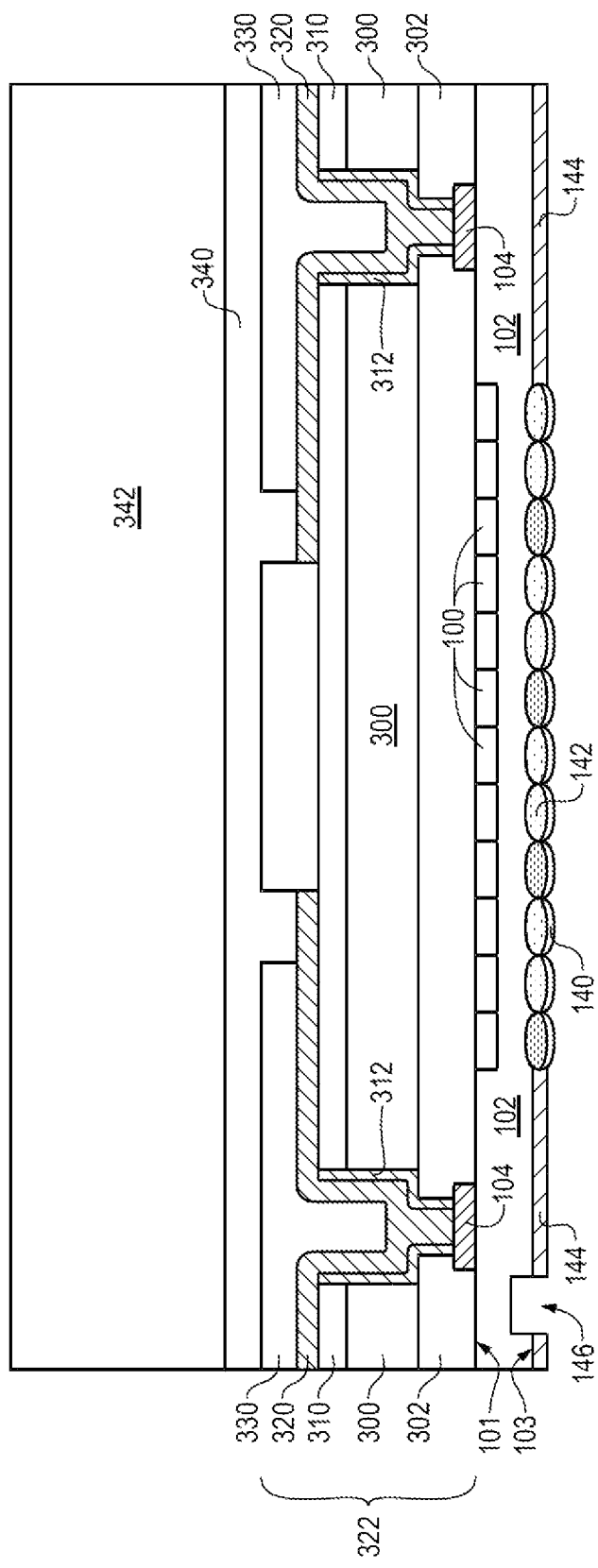
FIG. 11A is a cross-sectional side view of the illustrative image wafer of FIG. 10B after formation of backside illumination elements on the back side of the image wafer in accordance with an embodiment of the present invention.

FIGS. 10A, 10B, and 11A are cross-sectional side views of the illustrative embodiment shown in FIG. 7C, of a BSI image sensor having a metal redistribution layer for providing solder bumps for connecting to external circuitry in later manufacturing stages in which backside illumination elements are added to back side 103 of image wafer 102. As shown in FIG. 10A, an adhesive layer such as adhesive layer 340 may be used to attach a temporary silicon carrier such as carrier 342 to RDL 322. As described in connection with FIG. 3A, in the example of FIG. 10B, semiconductor substrate 102 may be thinned to a thickness 130 suitable for backside illumination of image pixels 100. Once thinned, image wafer 102 may have a back side such as back side 103 of FIG. 10B.

As shown in FIG. 11A, following thinning of image wafer 102 to desired thickness 130, a backside illumination and color filter array processing step is performed as described in connection with FIG. 3B. Following BSI and CFA formation processes, as shown in FIG. 11A, image wafer 102 may be provided with a color filter array having color filters 142 formed on back surface 103 of substrate 102. Image wafer 102 may also have array of microlenses such as microlenses 140 formed on each respective color filter 142 from the back side of image wafer 102. Each microlens 140 may be used to concentrate incoming light onto one associated image pixels 100 through one associated color filter 142. As shown in FIG. 11A, a portion of back side 103 of image wafer 102 may be coated in a light blocking material such as light blocking material 144. If needed, alignment marks 146 may be opened in the silicon to align backside elements such as microlenses 140 and color filters 142 with front side elements such as image pixels 100.

Figure 11B:
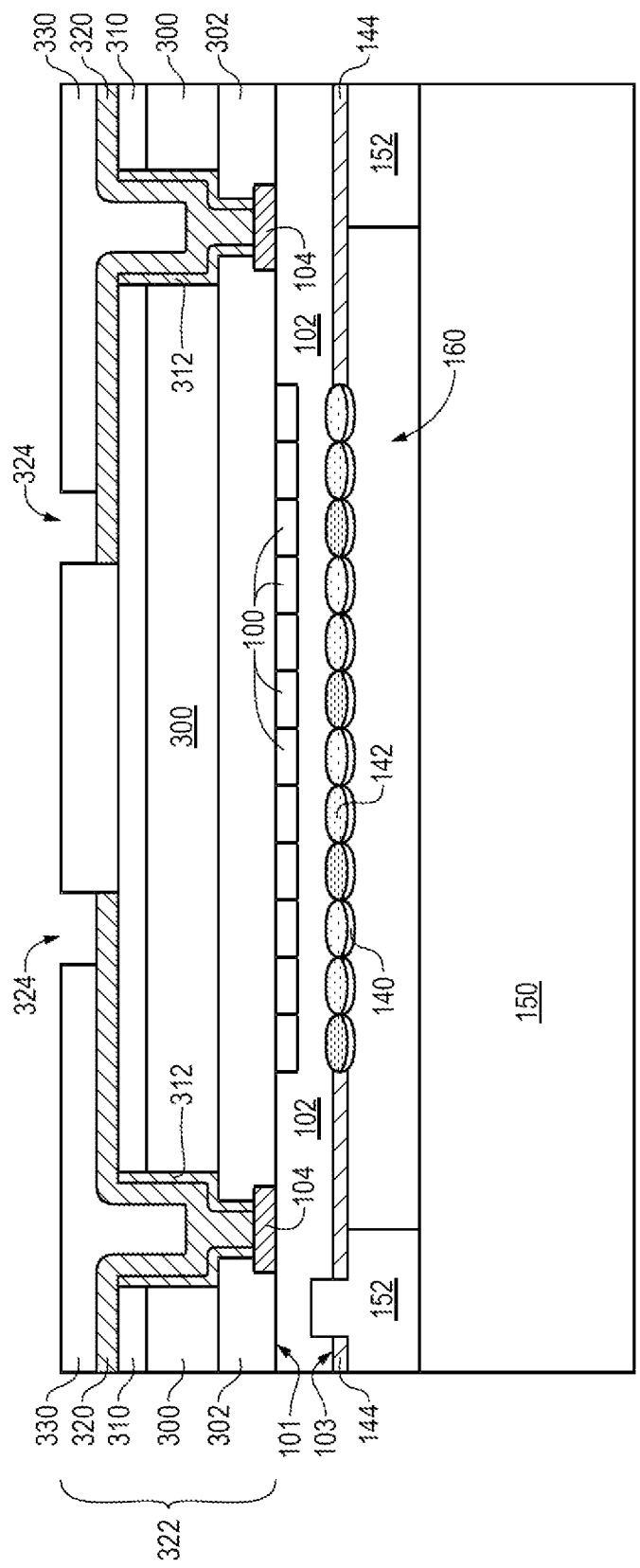
FIG. 11B is a cross-sectional side view of the illustrative image wafer of FIG. 11A after attaching a cover layer to the back side of the image wafer and detaching the temporary carrier in accordance with an embodiment of the present invention.

FIG. 11B is cross-sectional side view of an illustrative BSI image sensor having a metal redistribution layer for providing solder bumps for connecting to external circuitry in a later manufacturing stage. As shown in FIG. 11B, a rigid cover layer such as cover layer 150 is mounted over the array of color filters 142. In mounting cover layer 150, a photo-definable dry film adhesive layer such as dry film adhesive 152 is applied to back side 103 of image wafer 102 covering microlenses 140 and color filters 142. Portions of dry film adhesive 152 in the vicinity of microlenses 140 and color filters 142 are then removed (i.e., photo-defined) to provide opening 160 over the array of microlenses 140. Cover layer 150 may then be attached to the remaining portions of dry film adhesive 152.

As shown in FIG. 11B, temporary carrier 342 may also be removed. Carrier 342 may be removed by thermal shear debonding, mechanical twist de-bonding or other suitable debonding methods. Following removal of carrier 342, remaining adhesive 340 may be removed using, as an example, a chemical solvent (e.g., IPA and acetone).

FIG. 12 is cross-sectional side view of an illustrative BSI image sensor having a metal redistribution layer for providing solder bumps for connecting to external circuitry in its final manufacturing stage. Following removal of carrier 342 and adhesive 340 as described in connection with FIG. 11B, solder bumps 170 may, if desired, be attached to BSI image sensor 400. BSI image sensor 400 may be provided without solder balls 170 allowing a user of BSI image sensor 400 to form wire bonds, metal bonds or other electrical contacts in contact with metallization layer 320 in openings 324. Attaching solder bumps 170 to image sensor 400 may be performed by screen printing solder paste into openings 324 in dielectric layer 330 onto metallization layer 320. Solder bumps 170 are then formed by reflowing (i.e., heating until melted) the solder paste to form solder balls. Alternatively, solder balls may be formed in openings 114 using ball drop, solder shooting, or other solder deposition methods. The wafer is then singulated into individual dies. The completed backside illuminated image sensor 400 having solder balls 170, as shown in the example of FIG. 12, includes a cover layer 150 attached to back side 103 of image wafer 102 using dry film adhesive 152.

In the final configuration shown (as an example) in FIG. 12, BSI image sensor 400 includes image wafer 102, cover layer 150, permanent carrier 300, redistribution layer 322 and solder balls 170. Image wafer image wafer 102 includes control circuitry and an array of image pixels 100 on a front side and an associated array of color filters 142 and an associated array of microlenses 140 on a back side. Image light 800 may be received through cover layer 150, microlenses 140 and color filters 142 on back side 103 of image wafer 102 before being absorbed by image pixels 100 mounted on front side 101 of image wafer 102. Behind image pixels 100, a redistribution layer such as redistribution layer 322 may be mounted to front side 101 of image wafer 102. Redistribution layer 322 may include dielectric layer 310, second dielectric layer 312, metallization layer 320 and third dielectric layer 330. Dielectric layers 310, 312, and 330 may be formed from a dry film photo-resistive material, a spin-on photo-resistive material, or other suitable dielectric material. The example of FIG. 12 is merely illustrative and other embodiments are possible.

Figure 13:
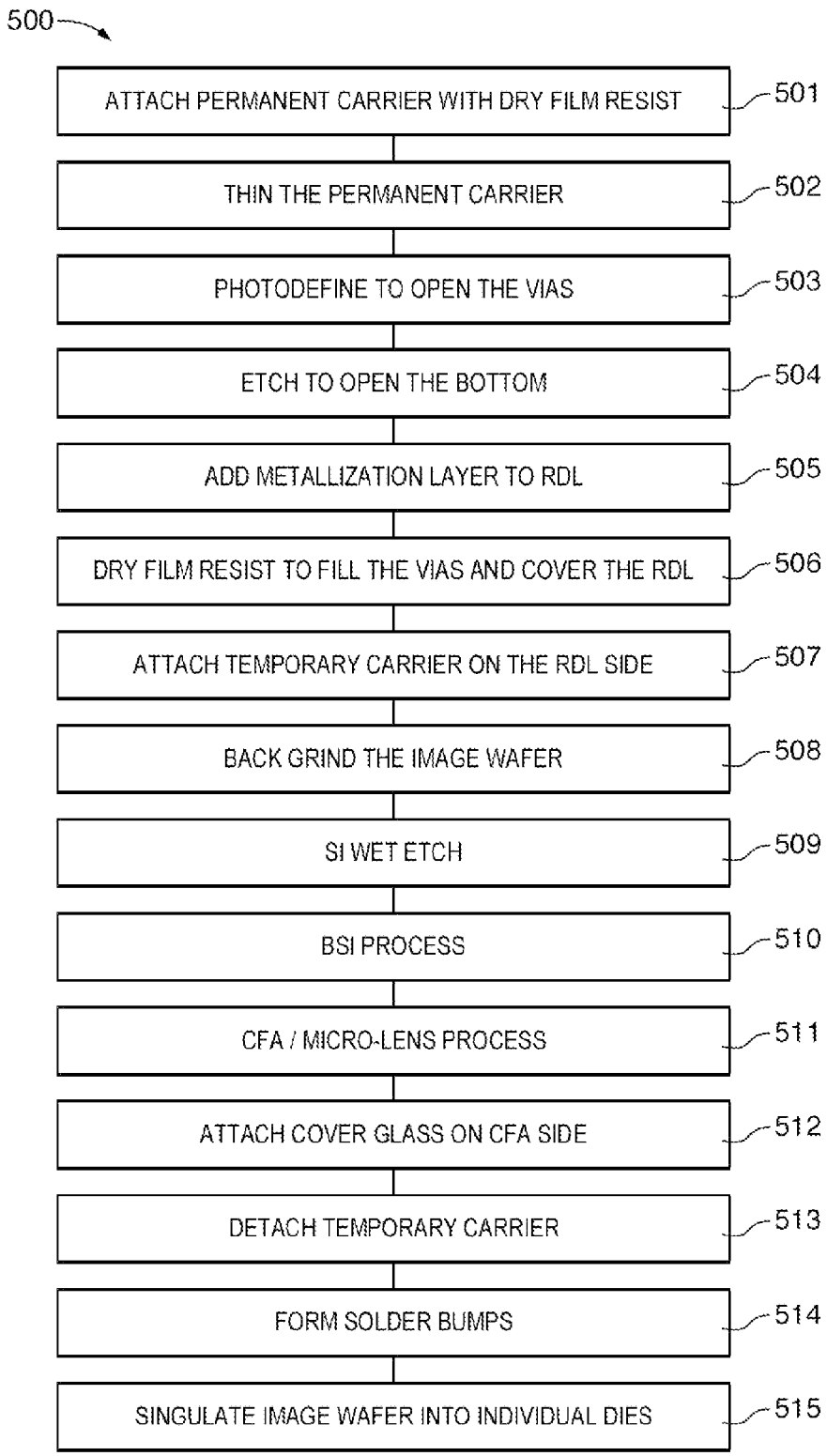
FIG. 13 is a flowchart of illustrative steps for producing a backside illuminated image sensor having a redistribution layer and solder bumps in accordance with an embodiment of the present invention.

FIG. 13 is a flowchart showing illustrative steps for producing BSI image sensors having solder bumps and metal redistribution layers. As shown in process 500 of FIG. 13, at step 501, a permanent carrier such as carrier 300 of FIG. 7B may be attached to image wafer 102 using adhesive layer 302. At step 502, carrier 300 is thinned as described in connection with FIG. 7C. At step 503, openings such as openings 314 of FIG. 8A are formed by photo-defining carrier 300 and, if desired, a first passivation layer applied to carrier 300 such as passivation layer 310 of FIG. 8A. Openings 314 may allow formation of through-silicon vias for connecting bond pads such as bond pads 104 of FIG. 8A to other components. At step 504, as described in connection with FIG. 8B, a second passivation layer such as passivation layer 312 may be applied to sidewalls 315 of openings 314. At step 505, photo-definition or dry etching may be used to remove dielectric 312 from the bottom of openings 314. At step 506, a metallization layer such as layer 320 of FIG. 9A may be formed on dielectric layer 310. At step 507, a third passivation layer such as passivation layer 330 may be applied on top of metallization layer 320 and dielectric layer 310. Passivation layer 330 may fill in through-silicon vias 316 and cover metallization layer 320 of redistribution layer 322. At step 507, passivation layer 330 may also, if desired, be photo-defined to provide openings 324. At step 508 a temporary carrier such as carrier 342 is attached to RDL 322 using an adhesive layer such as adhesive layer 340 of FIG. 10A. At step 509, the image wafer (silicon substrate) is back grinded to a desired thickness such as thickness 130 of FIG. 10B. At step 510, the image wafer may optionally be further thinned using a silicon wet etch. At step 511, a back side of the image wafer such as back side 103 of image wafer 102 of FIG. 3B is further prepared for backside illumination of photosensors on front side 103 of image wafer 102 using a standard BSI process.

Following BSI processing in step 511, at step 512 a color filter array (CFA) may be formed on back side 103 of image wafer 102. Microlenses such as microlenses 140 of FIG. 11A may then be formed over the color filter array on back side 103 of image wafer 102 in a CFA/μlens process. Following the CFA/microlens process, at step 513, a cover layer (sometimes referred to as a cover glass) such as cover layer 150 may be attached to back side 103 of image wafer 102 covering color filters 142 of the CFA. At step 515, the image wafer is singulated into individual dies.

As described in connection with FIG. 4A, cover layer 150 may also be formed from other transparent materials such as plastic. Cover layer 150 may be attached to image wafer 102 using a patterned adhesive film such as patterned dry film adhesive 152 of FIG. 11B. Following attaching cover glass 150, at step 514, the temporary carrier attached in step 202 may be removed using thermal shear or other de-bonding methods. At step 515, solder bumps such as solder bumps 170 of FIG. 12 may be formed in openings 324 in order to provide electrical contact with metallization layer 320 of redistribution layer 322 and therefore with bond pads 104.

FIGS. 14A-C, 15A-C, 16A, 16B, 17A, 17B, 18A, and 18B are cross-sectional side views of another illustrative embodiment of a BSI image sensor having a metal redistribution layer for providing solder bumps for connecting to external circuitry in various manufacturing stages.

As shown in FIG. 14A, as in FIG. 7A, substrate 102 may be provided with conductive bond pads 104 and image pixels 100 formed on front side 101 of semiconductor substrate 102. Semiconductor substrate 102 may also have control circuitry formed on front side 101. As shown in FIG. 14B, a permanent carrier such as carrier 300 may be attached to front side 101 of image wafer 102 using a permanent adhesive layer such as adhesive layer 302. Adhesive layer 302 may be patterned (i.e., photo-defined) to provide openings 304 in adhesive layer 302 for later access to metal bond pads 104. In an alternative arrangement, carrier 300 may be attached directly to image wafer 102 using an oxide-oxide bonding process (i.e. and oxide layer on carrier 300 may be bonded to a thin layer of oxide applied to image wafer 102). If an oxide-oxide bonding process is used, openings 304 may be formed at a later stage of manufacture than that shown in FIG. 7B. Carrier 300 may also, if desired, be attached to front side 101 of image wafer 102 using another permanent adhesive.

Figure 14C:
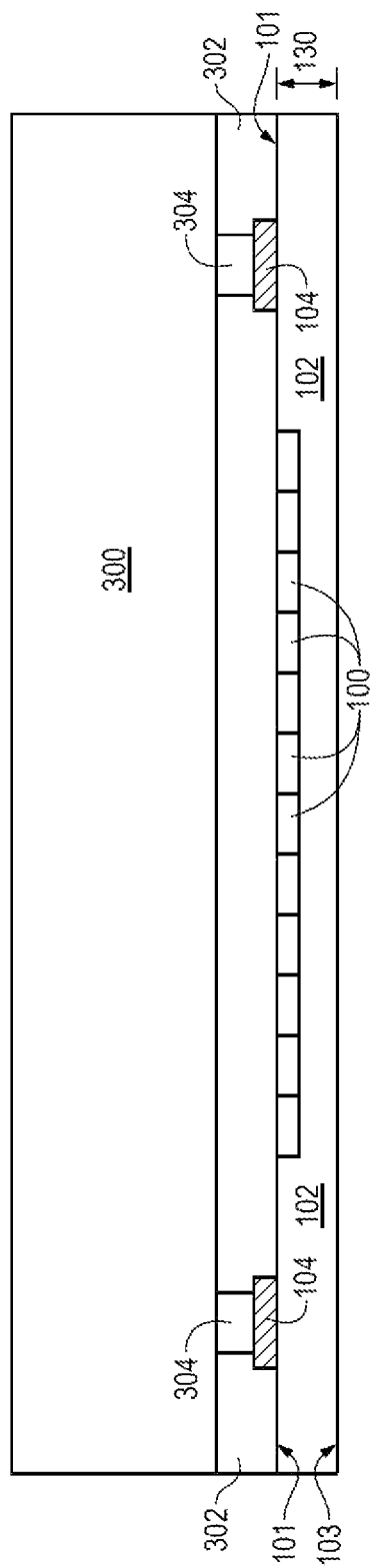
FIG. 14C is a cross-sectional side view of the illustrative image wafer of FIG. 14B after thinning the image wafer in accordance with an embodiment of the present invention.

As shown in FIG. 14C, following attaching permanent carrier 300 to image wafer 102, semiconductor substrate 102 may be thinned to a thickness 130 suitable for backside illumination of image pixels 100. Once thinned, image wafer 102 may have a back side such as back side 103 of FIG. 14C.

As shown in FIG. 14C, following thinning of image wafer 102 to desired thickness 130, a backside illumination and color filter array processing step is performed as described in connection with FIG. 3B. Following BSI and CFA formation processes, as shown in FIG. 15A, image wafer 102 may be provided with a color filter array having color filters 142 formed on back surface 103 of substrate 102. Image wafer 102 may also have array of microlenses such as microlenses 140 formed on each respective color filter 142 from the back side of image wafer 102. Each microlens 140 may be used to concentrate incoming light onto one associated image pixels 100 through one associated color filter 142.

FIG. 15A shows manufacturing stage in which backside illumination elements are added to back side 103 of image wafer 102. As shown in FIG. 15A, a portion of back side 103 of image wafer 102 may be coated in a light blocking material such as light blocking material 144. If needed, alignment marks 146 may be opened in the silicon to align backside elements such as microlenses 140 and color filters 142 with front side elements such as image pixels 100.

As shown in FIG. 15B, an adhesive layer such as adhesive layer 602 may be used to attach a temporary silicon carrier such as carrier 600 to back side 103 of image wafer 102. As shown in FIG. 15C, carrier 300 may be thinned to a thickness 310. Thickness 310 may be between 80 microns and 100 microns or may be any other thickness that provides strength to the assembly while allowing formation of through-silicon vias as shown in subsequent figures. Carrier 300 may be thinned using any suitable thinning process such as those described in connection with FIG. 3A.

Figure 16A:
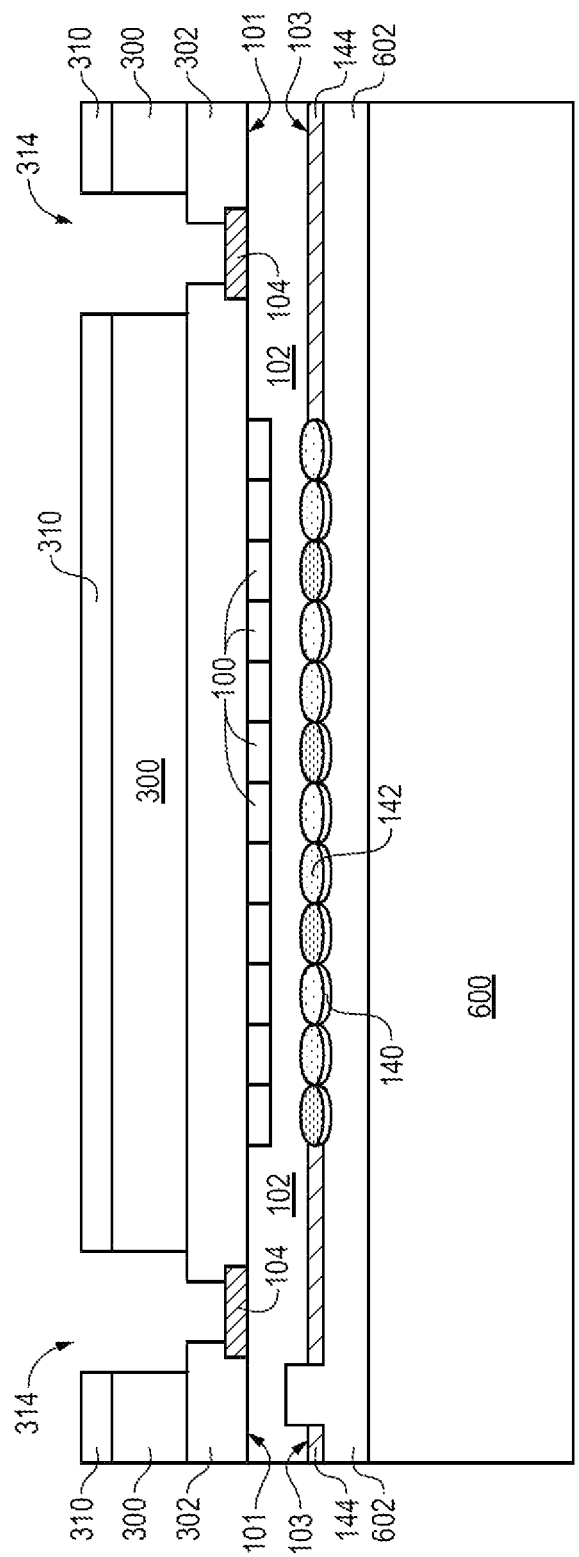
FIG. 16A is a cross-sectional side view of the illustrative image wafer of FIG. 15C after formation of a first dielectric layer on the permanent carrier in accordance with an embodiment of the present invention.

FIGS. 16A, 16B, 17A, and 17B are cross-sectional side views of the illustrative embodiment shown in FIG. 15C, of a BSI image sensor having a metal redistribution layer for providing solder bumps for connecting to external circuitry in later manufacturing stages in which a redistribution layer is added front side 101 of image wafer 102. In the example of FIG. 16A, image wafer 102 already has backside imaging structures such as microlenses 140 and color filters 142 on back side 103. FIG. 16A shows addition of a first passivation layer such as passivation layer 310 on top of permanent carrier 300. Passivation layer 310 may be formed form any suitable permanent photo-definable dielectric. Permanent photo-definable dielectrics may be thermosetting dielectrics (i.e., dielectrics that cure upon application of heat).

Dielectric layer 310 may, as shown in FIG. 16A, be patterned so as to have openings such as openings 314 over bond pads 104. In the same patterning step, openings 314 may be extended into silicon carrier 310 in order to expose bond pads 104.

Figure 16B:
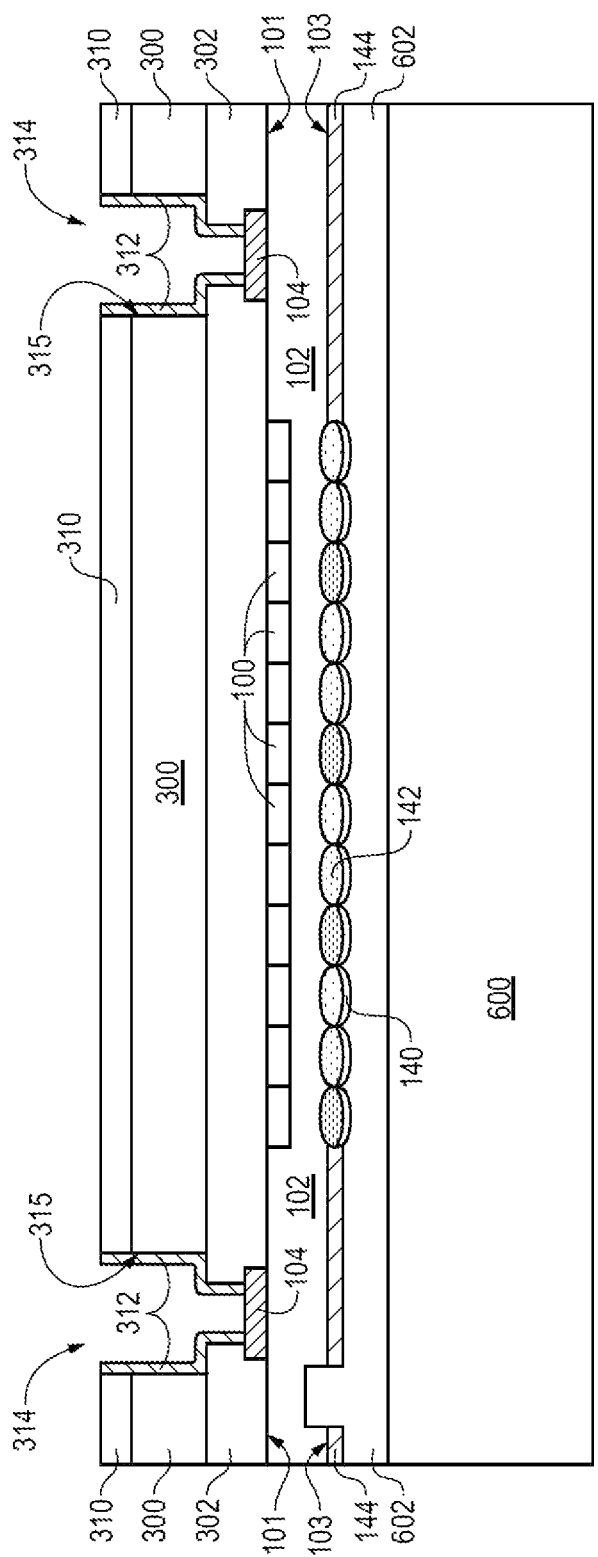
FIG. 16B is a cross-sectional side view of the illustrative image wafer of FIG. 16A after formation of a second passivation layer in openings in the first passivation layer and the permanent carrier in accordance with an embodiment of the present invention.

As shown in FIG. 16B, a second passivation layer such as passivation layer 312 may be added to sidewalls 315 of openings 314. Passivation layer 312 may be a spin on dielectric, a chemical vapor deposited dielectric or other dielectric. Passivation layer 312 may be formed on sidewalls 315 of opening 314 by spinning on a dielectric then using a photo-defining procedure to remove material from the bottom of openings 314. If passivation layer 312 is not photo-definable, dielectric material may be removed from the bottom of openings 314 using a dry etch process.

Figure 17A:
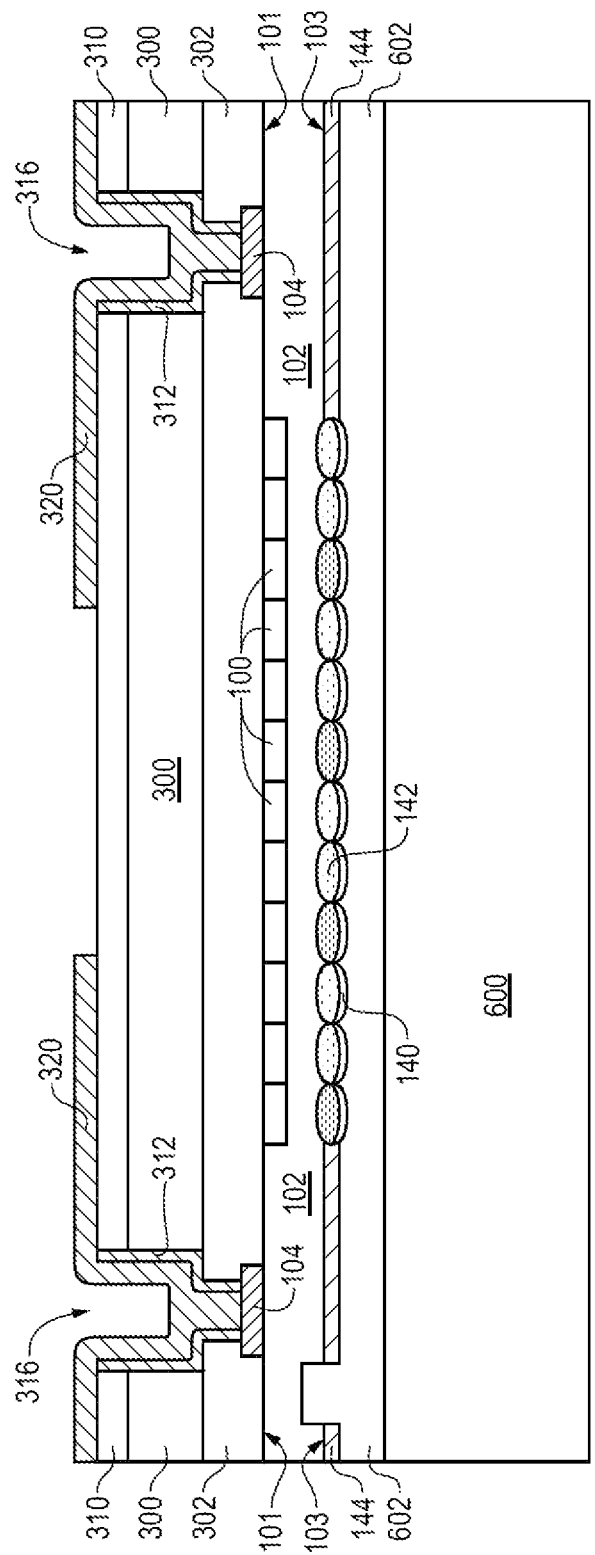
FIG. 17A is a cross-sectional side view of the illustrative image wafer of FIG. 16B after formation of a metallization layer in accordance with an embodiment of the present invention.

FIG. 17A shows a subsequent step in the formation of a RDL on front side 101 of image wafer 102 already having BSI components such as microlenses 140 and color filters 142 on back side 103. As shown in FIG. 17A, a patterned metallization layer such as metallization layer 320 may be formed over passivation layer 300. Metallization layer 320 may be formed from any suitable conductive material or combination of conductive materials (e.g., titanium, copper, nickel, palladium etc.). Metallization layer 320 may be patterned to contact bond pads 104 through openings 314 in dielectric layer 312 and silicon carrier 300 forming through-silicon vias such as through-silicon vias 316.

Figure 17B:
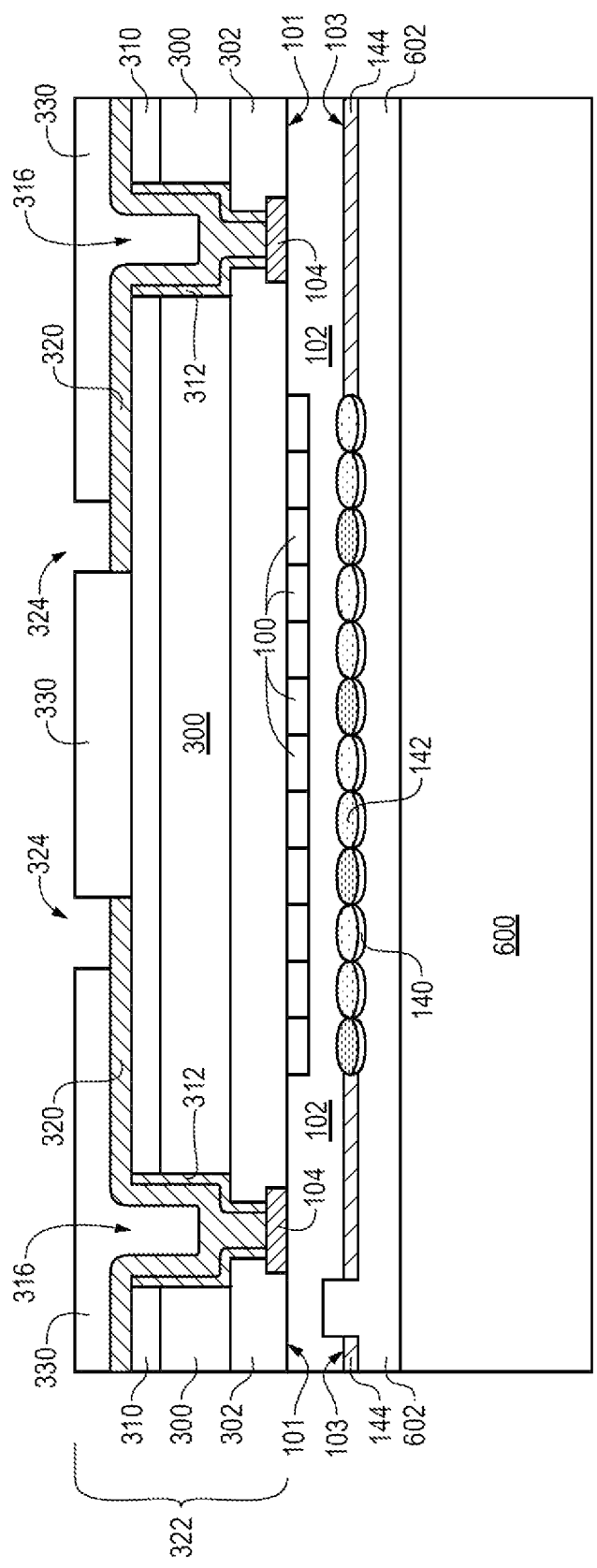
FIG. 17B is a cross-sectional side view of the illustrative image wafer of FIG. 17A having a redistribution layer in accordance with an embodiment of the present invention.

As shown in FIG. 17B, a redistribution layer such as RDL 322 may include a third patterned dielectric layer such as dielectric layer 330 formed on top of dielectric layer 310 and metallization layer 320. Dielectric layer 330 may be patterned having openings such as openings 324 that provide access to metallization layer 320 in order to provide electrical contact bond pads 104. Openings 324 may provide electrical contacts in a redistributed pattern with respect to the pattern of bond pads 104 (i.e., the location of openings 324 define where solder balls will ultimately be placed). Third passivation layer 330 may have light blocking properties (e.g., infrared absorption) in order to prevent light from front side 101 of image wafer 102 from reaching image pixels 100. Passivation layer 330 may be formed from a single dielectric material or may be made of multiple layers including a dry film laminate dielectric and a photo-definable infrared-blocking coating.

In the example of FIG. 17B, redistribution layer 322 includes first passivation layer 310, second dielectric passivation layer 312, metallization layer 320, and third passivation layer 330. RDL 322 may include through-silicon vias 316 through silicon carrier 300.

FIG. 18A is cross-sectional side view of an illustrative BSI image sensor having a metal redistribution layer for providing solder bumps for connecting to external circuitry in a later manufacturing stage. As shown in FIG. 18A temporary carrier 600 may also be removed. Carrier 600 may be removed by thermal shear de-bonding, mechanical twist de-bonding or other suitable de-bonding methods. Following removal of carrier 600, remaining adhesive 602 may be removed using, as an example, a chemical solvent (e.g., IPA and acetone).

FIG. 18B is cross-sectional side view of an illustrative BSI image sensor having a metal redistribution layer for providing solder bumps for connecting to external circuitry in a final manufacturing stage. Following removal of carrier 600 and adhesive 602 as described in connection with FIG. 18A, solder bumps 170 may, if desired, be attached to BSI image sensor 900. BSI image sensor 900 may be provided without solder balls 170 allowing a user of BSI image sensor 900 to form wire bonds, metal bonds or other electrical contacts in contact with metallization layer 320 in openings 324. Attaching solder bumps 170 to image sensor 900 may be performed by screen printing solder paste into openings 324 in dielectric layer 330 onto metallization layer 320. Solder bumps 170 are then formed by reflowing (i.e., heating until melted) the solder paste to form solder balls. Alternatively, solder balls may be formed in openings 114 using ball drop, solder shooting, or other solder deposition methods. The wafer is then singulated into individual dies. The completed backside illuminated image sensor 900 having solder balls 170, is shown in the example of FIG. 18B.

In the final configuration shown (as an example) in FIG. 18B, BSI image sensor 900 includes image wafer 102, permanent carrier 300, redistribution layer 322 and solder bumps 170. Image wafer 102 includes control circuitry and an array of image pixels 100 on a front side and an associated array of color filters 142 and an associated array of microlenses 140 on a back side. Image light may be received through microlenses 140 and color filters 142 on back side 103 of image wafer 102 before being absorbed by image pixels 100 mounted on front side 101 of image wafer 102. Behind image pixels 100, a redistribution layer such as redistribution layer 322 may be mounted to front side 101 of image wafer 102. Redistribution layer 322 may include dielectric layer 310, second dielectric layer 312, metallization layer 320 and third dielectric layer 330. Dielectric layers 310, 312, and 330 may be formed from a dry film photo-resistive material, a spin-on photo-resistive material, or other suitable dielectric material. The example of FIG. 18B is merely illustrative and other embodiments are possible.

Figure 19:
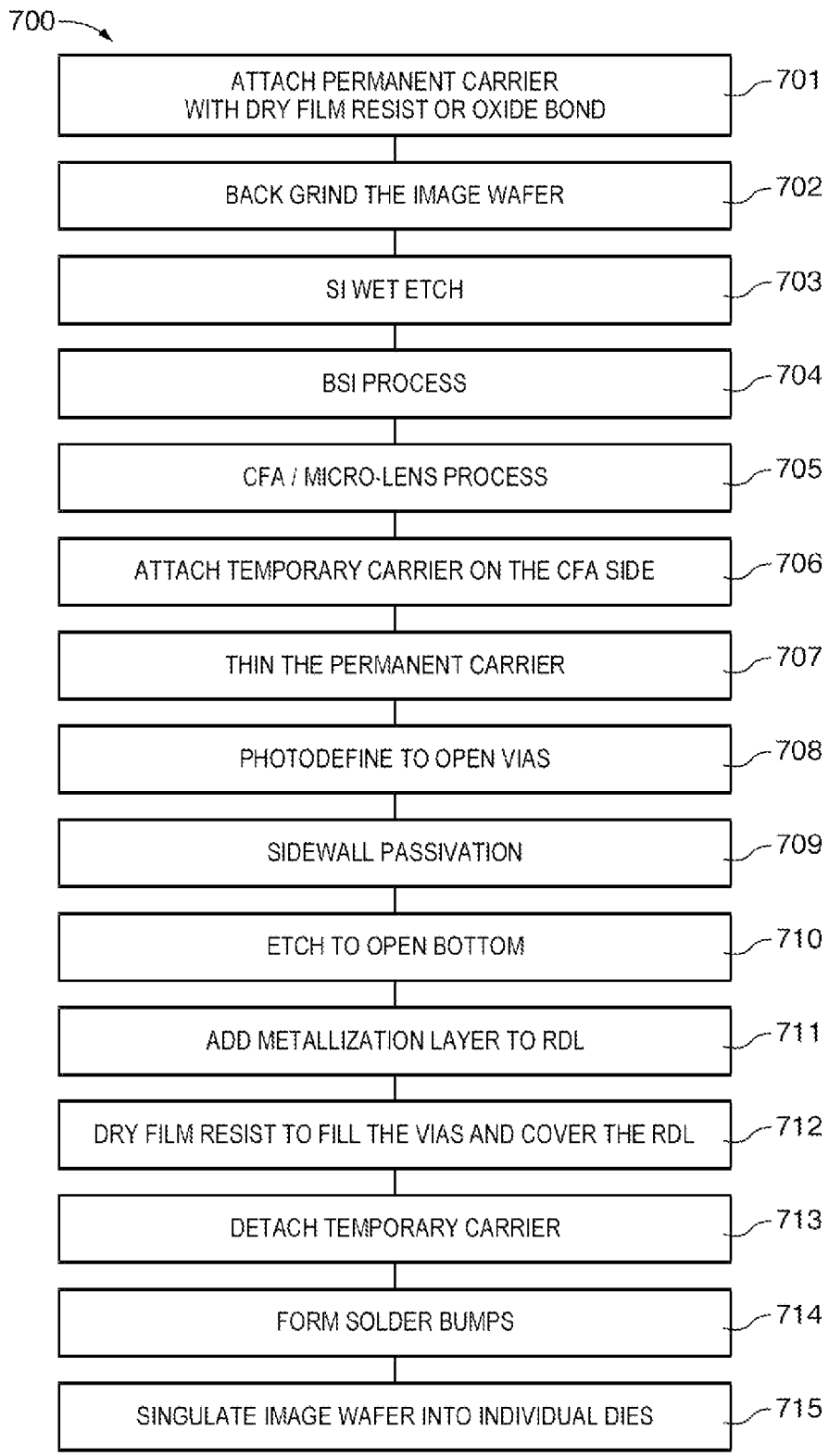
FIG. 19 is a flowchart of illustrative steps for producing a backside illuminated image sensor having a redistribution layer and solder bumps in accordance with an embodiment of the present invention.

FIG. 19 is a flowchart showing illustrative steps for producing BSI image sensors having solder bumps and metal redistribution layers. As shown in process 700 of FIG. 19, at step 701, a permanent carrier such as carrier 300 of FIG. 14B may be attached to image wafer 102 using adhesive layer 302. At step 702, the image wafer (silicon substrate) is back grinded to a desired thickness such as thickness 130 of FIG. 14C. At step 703, the image wafer may optionally be further thinned using a silicon wet etch. At step 704, a back side of the image wafer such as back side 103 of image wafer 102 of FIG. 14B is further prepared for backside illumination of photosensors on front side 103 of image wafer 102 using a standard BSI process. The BSI process of step 704 may include forming a patterned light block material on back side 103 of image wafer 102 and opening alignment marks such as alignment marks 146 of FIG. 15A.

Following BSI processing in step 704, at step 705 a color filter array (CFA) may be formed on back side 103 of image wafer 102. Microlenses such as microlenses 140 of FIG. 15A may then be formed over the color filter array on back side 103 of image wafer 102 in a CFA/µlens process.

At step 706, a temporary carrier such as carrier 600 may be attached to back side 103 of image wafer 102 using adhesive layer 602, as shown in FIG. 15B. At step 707, permanent carrier 300 is thinned as described in connection with FIG. 7C. At step 708, openings such as openings 314 of FIG. 16A are formed by photo-defining carrier 300 and, if desired, a first passivation layer applied to carrier 300 such as passivation layer 310 of FIG. 16A. Openings 314 may allow formation of through-silicon vias for connecting bond pads such as bond pads 104 of FIG. 16A to a redistribution layer in later steps. At step 709, as described in connection with FIG. 16B, a second passivation layer such as passivation layer 312 may be applied to sidewalls 315 of openings 314. At step 710, photo-definition or dry etching may be used to remove dielectric 312 from the bottom of openings 314, exposing bond pads 104. At step 711, a metallization layer such as layer 320 of FIG. 17A may be formed on dielectric layer 310. At step 712, a third passivation layer such as passivation layer 330 may be applied on top of metallization layer 320 and dielectric layer 310. Passivation layer 330 may fill in through-silicon vias 316 and cover metallization layer 320 of redistribution layer 322. At step 712, passivation layer 330 may also, if desired, be photo-defined to provide openings 324. At step 713 temporary carrier 600 attached in step 706 may be removed using thermal shear or other de-bonding methods. At step 714, solder bumps such as solder bumps 170 of FIG. 18B may, if desired, be formed in openings 324 in order to provide electrical contact with metallization layer 320 of redistribution layer 322 and therefore with bond pads 104. At step 715, the image wafer is singulated into individual dies.

Various embodiments have been described illustrating for forming backside illuminated image sensors having metal redistribution layers and solder bumps for connection to external circuitry. In one embodiment, a BSI image sensor with RDL and solder bumps may be formed using a temporary carrier during manufacture that is removed during manufacture. In another embodiment, a BSI image sensor with RDL and solder bumps may be formed using a permanent carrier during manufacture that partially remains in the final image sensor. BSI image sensors with RDL and solder bumps may be provided with microlens arrays and color filter arrays on a back side of an image wafer and image pixels on a front side of an image wafer. Embodiments are possible in which a BSI image sensor is formed before formation of a redistribution layer on the front side of the BSI image sensor. Other embodiments are possible in which a redistribution layer is formed on the front side of an image wafer before formation of BSI components such as microlenses and color filters are formed on the back side of the image wafer. In some configurations, BSI image sensors with RDL's and solder bumps may be provided with a cover glass over the microlens and color filter arrays on the front side of the image wafer. In other configurations, no cover layer is provided.

The foregoing is merely illustrative of the principles of this invention which can be practiced in other embodiments.

What is claimed is:
1. A method of forming an image sensor comprising:
attaching a permanent carrier and a semiconductor substrate;
thinning the semiconductor substrate that is attached to the permanent carrier, wherein the thinned semiconductor substrate has opposing first and second sides, and wherein the permanent carrier is attached to the first side;

forming an array of photosensitive elements and associated control circuitry on the first side and forming an array of corresponding color filter elements on the second side, wherein image light reaches the photosensitive elements by passing through the color filter elements on the second side;

forming bond pads on the first side of the semiconductor substrate;

attaching a temporary carrier to the second side of the semiconductor substrate;

thinning the permanent carrier that is attached to the semiconductor substrate; and forming through-silicon vias through the permanent carrier that has been attached to the semiconductor substrate, wherein forming the through-silicon vias through the permanent carrier comprises:
 forming a first dielectric layer on the permanent carrier such that the first dielectric layer does not contact the bond pads;
 forming at least one opening in the first dielectric layer and the permanent carrier, wherein the at least one opening has sidewalls; and
 forming a second dielectric layer on the sidewalls of the at least one opening such that the second dielectric layer contacts the bond pad.

2. The method defined in claim 1 further comprising:
after forming the array of corresponding color filter elements on the second side, forming an array of associated microlenses on the second side.

3. The method defined in claim 2 wherein attaching the temporary carrier to the second side of the semiconductor substrate comprises attaching the temporary carrier to the second side of the semiconductor substrate before forming the through silicon vias through the permanent carrier that has been attached to the semiconductor substrate.

4. The method defined in claim 3 further comprising:
forming a redistribution layer on the permanent carrier, wherein forming the redistribution layer comprises:
 forming openings in the second dielectric layer; and
 forming a metallization layer over at least a portion of the second dielectric layer, wherein the metallization layer has at least a portion in the openings in the second dielectric layer.

5. The method defined in claim 4 further comprising:
detaching the temporary carrier from the semiconductor substrate that is attached to the permanent carrier on which the redistribution layer has been formed.

6. The method defined in claim 5 further comprising forming solder balls in the openings in the at least one dielectric layer.

7. The method defined in claim 1, further comprising:
singulating the permanent carrier and the semiconductor substrate.

8. The method defined in claim 1 wherein thinning the semiconductor substrate that is attached to the permanent carrier comprises back grinding the semiconductor substrate that is attached to the permanent carrier.

9. The method defined in claim 1, further comprising:
forming a layer of thermosetting dielectric material on the permanent carrier.

* * * * *